(12) United States Patent
Ito et al.

(10) Patent No.: US 7,256,104 B2
(45) Date of Patent: Aug. 14, 2007

(54) SUBSTRATE MANUFACTURING METHOD AND SUBSTRATE PROCESSING APPARATUS

(75) Inventors: Masataka Ito, Kanagawa (JP); Kenji Yamagata, Kanagawa (JP); Yasuo Kakizaki, Kanagawa (JP); Kazuhito Takanashi, Kanagawa (JP); Hiroshi Miyabayashi, Kanagawa (JP); Ryuji Moriwaki, Kanagawa (JP); Takashi Tsuboi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 174 days.

(21) Appl. No.: 10/841,621

(22) Filed: May 10, 2004

(65) Prior Publication Data

US 2004/0259328 A1    Dec. 23, 2004

(30) Foreign Application Priority Data

| May 21, 2003 | (JP) | ............................. 2003-143492 |
| May 27, 2003 | (JP) | ............................. 2003-149569 |
| Mar. 8, 2004 | (JP) | ............................. 2004-064495 |

(51) Int. Cl.
  *H01L 21/46* (2006.01)
  *H01L 21/30* (2006.01)
  *H01L 21/762* (2006.01)

(52) U.S. Cl. ................ 438/459; 438/455; 257/E21.57; 257/E21.567; 257/E21.569

(58) Field of Classification Search ................ 438/459, 438/455; 257/E21.567, E21.568, E21.569, 257/E21.57
See application file for complete search history.

(56) References Cited

U.S. PATENT DOCUMENTS 5,670,411 A * 9/1997 Yonehara et al. ........... 438/459
5,856,229 A * 1/1999 Sakaguchi et al. .......... 438/406
5,869,387 A    2/1999 Sato et al. .................. 438/459
6,121,117 A    9/2000 Sato et al. .................. 438/459
6,221,738 B1* 4/2001 Sakaguchi et al. .......... 438/455
6,372,609 B1* 4/2002 Aga et al. ................... 438/459

(Continued)

FOREIGN PATENT DOCUMENTS

EP     0 514 046 A1    11/1992

(Continued)

OTHER PUBLICATIONS

Atsushi Ogura, "Thinning of SOI Bonded Wafers by Applying Voltage During KOH Etching: Improvement of Thickness Variation by Reducing Leakage Current," 36 *Jpn. J. Appl. Phys.* 1519-1521 (Mar. 1997).

*Primary Examiner*—Luan Thai
(74) *Attorney, Agent, or Firm*—Fitzpatrick, Cella, Harper & Scinto

(57) ABSTRACT

An SOI substrate which has a thick SOI layer is first prepared. Then, the SOI layer is thinned to a target film thickness using as a unit a predetermined thickness not more than that of one lattice. This thinning is performed by repeating a unit thinning step which includes an oxidation step of oxidizing the surface of the SOI layer by the predetermined thickness not more than that of one lattice and a removal step of selectively removing silicon oxide formed by the oxidation. The SOI layer of the SOI substrate is chemically etched by supplying a chemical solution to the SOI layer, and the film thickness of the etched SOI layer is measured. When the measured film thickness of the SOI layer has a predetermined value, a process of chemically etching the SOI layer ends.

17 Claims, 21 Drawing Sheets

U.S. PATENT DOCUMENTS

| | | | |
|---|---|---|---|
| 6,461,939 B1 | 10/2002 | Furihata et al. | 438/459 |
| 6,653,209 B1 | 11/2003 | Yamagata | 438/459 |
| 6,884,696 B2 | 4/2005 | Aga et al. | 438/459 |
| 2003/0045131 A1 | 3/2003 | Verbeke et al. | 438/795 |
| 2003/0087503 A1* | 5/2003 | Sakaguchi et al. | 438/406 |

FOREIGN PATENT DOCUMENTS

| | | |
|---|---|---|
| EP | 0 594 206 A2 | 4/1994 |
| EP | 1 296 367 A1 | 3/2003 |
| JP | 1-107545 | 4/1989 |
| JP | 5-217821 | 8/1993 |
| JP | 5-218053 | 8/1993 |
| JP | 7-183477 | 7/1995 |
| JP | 9-8258 | 1/1997 |
| JP | 9-283484 | 10/1997 |
| JP | 2000-124092 | 4/2000 |
| JP | 2000-294470 | 10/2000 |
| JP | 2001-85310 | 3/2001 |
| JP | 2001-168308 | 6/2001 |
| JP | 2002-270801 | 9/2002 |
| JP | 2002-280347 | 9/2002 |
| WO | WO 03/009386 A1 | 1/2003 |

* cited by examiner

FIG. 12

CHANGE IN SURFACE PLANARITY OF SOI LAYER DUE TO THINNING
( THINNING AMOUNT : 30 nm )

| MICROROUGHNESS (RMS) | 1um☐ | 2um☐ | 5um☐ | 10um☐ | 20um☐ |
|---|---|---|---|---|---|
| BEFORE THINNING | 0.088 | 0.097 | 0.114 | 0.129 | 0.135 |
| PRESENT INVENTION | 0.095 | 0.099 | 0.115 | 0.127 | 0.149 |
| AFTER THERMAL OXIDATION / OXIDE FILM ETCHING | 0.161 | 0.148 | 0.161 | 0.168 | 0.163 |
| AFTER SC-1 ETCHING | 0.174 | 0.152 | 0.158 | 0.138 | 0.128 |

UNIT : nm

FIG. 13

| Position | Average | Range | Max | Min | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|---|---|---|---|
| BEFORE THINNING | 55.4 | 3.1 | 56.7 | 53.6 | 56.7 | 56.0 | 55.6 | 55.4 | 56.4 | 55.5 | 53.6 | 54.5 | 55.5 | 55.1 | 54.8 | 55.7 | 56.7 | 56.1 | 55.5 | 55.1 | 54.3 |
| AFTER THINNING | 11.2 | 3.4 | 12.8 | 9.4 | 12.8 | 11.6 | 12.0 | 10.9 | 12.2 | 11.0 | 9.4 | 10.8 | 10.6 | 10.3 | 11.1 | 11.4 | 12.5 | 11.8 | 11.1 | 11.5 | 9.5 |
| DIFFERENCE | 44.2 | 1.3 | 44.9 | 43.6 | 43.9 | 44.4 | 43.6 | 44.5 | 44.2 | 44.5 | 44.2 | 43.7 | 44.9 | 44.8 | 43.7 | 44.3 | 44.2 | 44.3 | 44.4 | 43.6 | 44.8 |

UNIT : nm

FIG. 14

| | NUMBER OF WAFERS | FILM THICKNESS OF SOI LAYER | | | |
|---|---|---|---|---|---|
| | | MEAN VALUE (nm) | MAXIMUM VALUE (nm) | MINIMUM VALUE (nm) | VARIATION (nm) |
| BEFORE THINNING | 225 | 58.4 | 66.6 | 55.1 | 11.5 |
| AFTER THINNING | 225 | 55.1 | 56.0 | 54.2 | 1.8 |

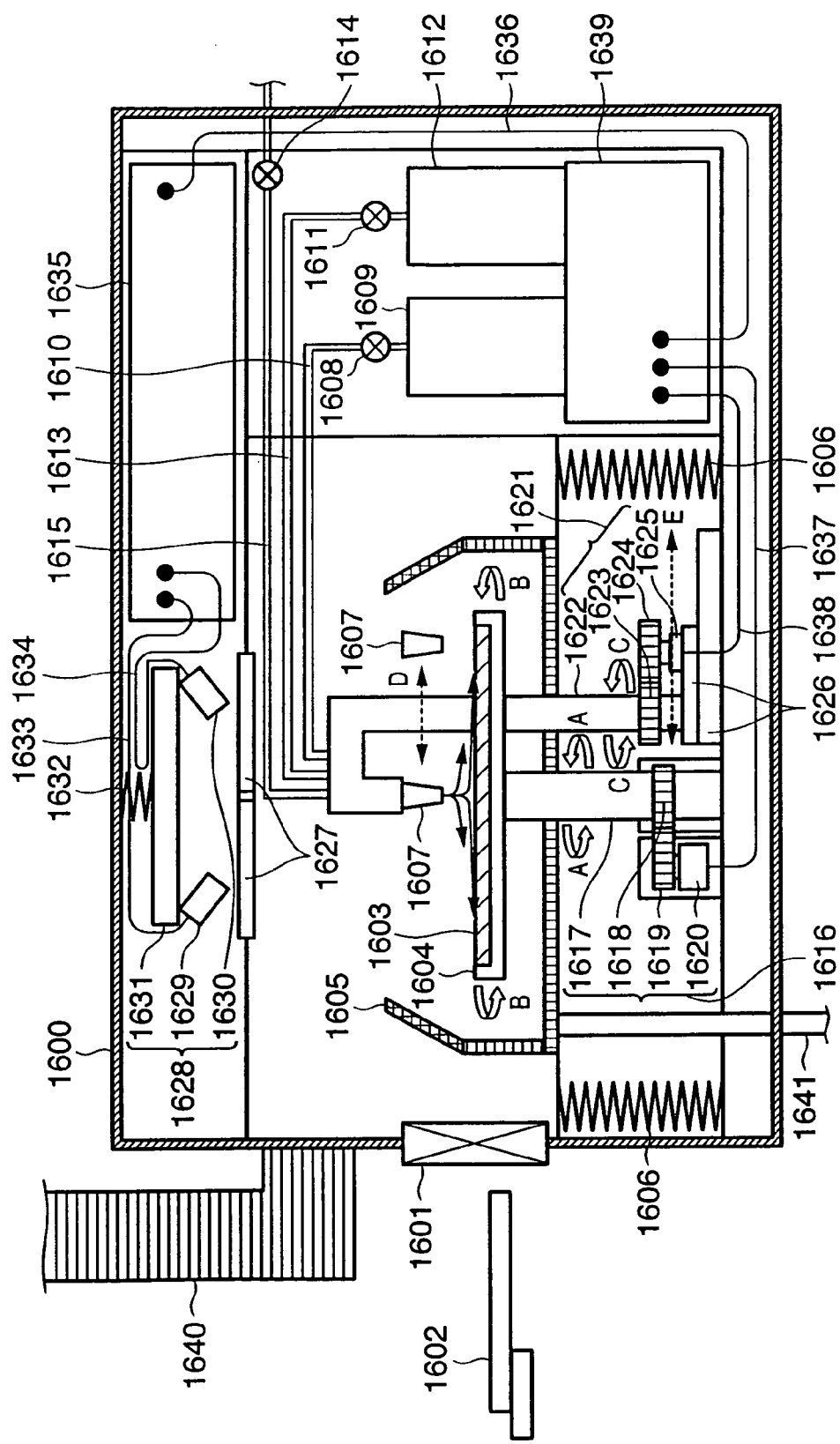

SUBSTRATE MANUFACTURING METHOD AND SUBSTRATE PROCESSING APPARATUS

FIELD OF THE INVENTION

The present invention relates to a substrate manufacturing method and substrate processing apparatus and, more particularly, to a substrate manufacturing method suitable for manufacturing a substrate which has an Si layer with a precisely adjusted thickness on an insulating layer, and a substrate processing apparatus.

BACKGROUND OF THE INVENTION

A substrate which has an Si layer on an insulating layer is known as an SOI (Silicon On Insulator) substrate. As SOI substrate manufacturing methods, SIMOX (Separation by IMplantation of OXygen), bonding, and the like are known.

SIMOX is a technique for implanting oxygen ions in an Si substrate at a predetermined depth and then annealing the substrate at a high temperature to form a buried silicon oxide layer.

Bonding is a method of bonding the first substrate which has a single-crystal Si layer on a separation layer and an insulating layer on the Si layer to the second substrate to form a bonded substrate stack and then dividing the bonded substrate stack at the separation layer. A method of forming a porous Si layer as the separation layer and epitaxially growing the single-crystal Si layer on the porous Si layer is known as ELTRAN (ELTRAN is a registered trademark). A method of using an ion-implanted layer as the separation layer to divide the bonded substrate stack by annealing is known as Smart Cut (Smart Cut is a registered trademark).

Typically, ELTRAN (registered trademark) selectively etches porous silicon left on the surface of an SOI layer after dividing the bonded substrate stack. In some cases, the surface of the SOI layer is rough after the selective etching. Japanese Patent Laid-Open No. 5-217821 discloses a technique for making the surface of the SOI layer extremely smooth by performing hydrogen annealing for an SOI substrate.

Recently, SOI layers have rapidly been thinning. A technique related to thinning of SOI layers is disclosed in Japanese Patent Laid-Open No. 2001-168308. Japanese Patent Laid-Open No. 2001-168308 discloses that in the manufacture of a thin silicon film, the thin silicon film arranged on an insulating surface is subjected to wet cleaning and is reduced in thickness to 100 nm or less. Japanese Patent Laid-Open No. 2001-168308 also discloses that an SC-1 cleaning solution (a solution mixture of $NH_4OH$, $H_2O_2$, and $H_2O$) is preferable as a cleaning solution, and an organic alkaline solution or a mixture of hydrofluoric acid and nitric acid can also be used. In addition, Japanese Patent Laid-Open No. 2001-168308 discloses a technique for reducing the thickness of a thin silicon film to 100 nm or less.

At present, the SOI layer in an SOI substrate has a sufficiently acceptable level of film thickness uniformity. The film thickness uniformity between substrates, however, is expected to have a tolerance of about ±1 nm. In a method using ion implantation, variations between substrates in depths where ions are implanted can cause variations in thicknesses of SOI layers. In a method using epitaxial growth, variations in thicknesses of single-crystal Si layers to be formed by epitaxial growth can lead to variations in thicknesses of SOI layers.

To reduce variations in the SOI layer between substrates in thicknesses, a polishing step or etching step can be adopted. Since polishing is a machine work, it is difficult for the present to stop polishing so as to maintain a high precision of ±1 nm or less with respect to a target film thickness. The rate of silicon etching using an SC-1 cleaning solution, an organic alkaline solution, a mixture of hydrofluoric acid and nitric acid is sensitive to the temperature and concentration of the chemical solution. To control the thickness of a thin silicon film at high precision (e.g., ±1 nm), these conditions must be controlled at extremely high precision.

In thinning of an SOI layer, defects such as a through hole (pinhole) and the like may increase with a decrease in thickness of the SOI layer. More specifically, the manufacturing process of an SOI substrate can adopt, e.g., a division step in which a mechanical stress can be applied to a layer to serve as an SOI layer and/or a polishing step. A stress which may be generated by these steps is more likely to cause defects with a decrease in thickness of the layer to serve as the SOI layer.

Under the circumstances, to meet demands for a thinner SOI layer, there is available a method of forming an SOI layer with a thickness large enough to prevent defects and then thinning the SOI layer to a desired thickness in the final step. To implement thinning, polishing, sacrificial oxidation (thermal oxidation and etching of a thermal oxide film), etching using an SC-1 cleaning solution, or the like may be preferable. However, in polishing, the SOI layer is mechanically damaged to cause defects. In sacrificial oxidation, for example, the thermal oxidation rate depends on the type and doping amount of an impurity doped in an Si layer, and thus variations are likely to occur in oxidation amount (the thickness of an oxidized portion). Also, the doping amount may change by thermal diffusion. In both of sacrificial oxidation and etching using the SC-1 cleaning solution, the surface roughness of the SOI layer may degrade.

Also, support for various types needs to be considered. In many cases, the specification value for the thickness of an SOI layer is determined by an application-specific demand from a device manufacturer as the user. For this reason, to meet a large number of demands, an SOI manufacturing process flexible toward a required film thickness must be established. For example, to manufacture ten types of SOI substrates with thicknesses of 10, 20, 30, 40, 50, 60, 70, 80, 90, and 100 nm by a SIMOX process using ion implantation, it is necessary to establish process conditions including ten types of ion implantation conditions corresponding to the thicknesses and manage them.

A conventional etching process is controlled mainly by the process time. If process conditions vary due to a change in concentration of a chemical solution or the like, it is difficult to precisely control the etching amount or film thickness.

Consequently, in repeating the etching process and film thickness measurement until a desired film thickness is obtained, the following operation is repeated. More specifically, a substrate to be processed is removed from the holder of a cleaning unit, the film thickness is measured by a film thickness measurement unit, and the substrate to be processed is attached again to the holder of the cleaning unit. This makes the work inefficient.

SUMMARY OF THE INVENTION

The present invention has been made in consideration of the above-mentioned problems, and has as its object to, e.g., facilitate thickness control of an SOI layer and/or eliminate major factors which may cause defects in the SOI layer and/or ensure high surface planarity and/or increase the flexibility toward the required specifications of the SOI layer.

It is another object of the present invention to precisely and efficiently control an etching process.

According to the present invention, the foregoing object is attained by providing a substrate manufacturing method comprising:

a preparation step of preparing a substrate which has a silicon layer on an insulating layer; and a thinning step of thinning the silicon layer on the insulting layer to a desired thickness, wherein in the thinning step, a unit thinning step including an oxidation step of oxidizing a surface of the silicon layer by a predetermined thickness, and a removal step of selectively removing silicon oxide formed in the oxidation step is performed not less than twice.

According to another aspect of the present invention, the foregoing object is attained by providing a substrate manufacturing method comprising:

a preparation step of preparing a substrate which has a silicon layer on an insulating layer; and a thinning step of thinning the silicon layer on the insulting layer to a desired thickness, wherein in the thinning step, a unit thinning step including an oxidation step of oxidizing a surface of the silicon layer by a predetermined thickness not more than a thickness of substantially one lattice and a removal step of selectively removing silicon oxide formed in the oxidation step is performed at least once.

According to another aspect of the present invention, the foregoing object is attained by providing a substrate processing apparatus suitable for processing a substrate which has a silicon layer on a insulating layer, comprising:

an oxidizing agent supply mechanism which supplies an oxidizing agent to the substrate to oxidize a surface of the silicon layer;

an etchant supply mechanism which supplies to the substrate an etchant for selectively etching silicon oxide to selectively remove silicon oxide formed on the surface of the silicon layer; and a controller which controls the oxidizing agent supply mechanism and etchant supply mechanism so as to repeat a unit thinning step of thinning the silicon layer by oxidizing the surface of the silicon layer to form silicon oxide and selectively removing the silicon oxide.

According to another aspect of the present invention, the foregoing object is attained by providing a substrate processing apparatus comprising:

an etching device which chemically etches a semiconductor layer of a semiconductor substrate by supplying a chemical to the semiconductor layer;

a film thickness measurement device which measures a thickness of the semiconductor layer; and a control unit which ends a process of chemically etching the semiconductor layer on the basis of a measurement result from the film thickness measurement device.

According to another aspect of the present invention, the foregoing object is attained by providing a substrate processing apparatus comprising:

a holder which holds a semiconductor substrate;

a chemical solution supply device which has a nozzle arranged above the holder and supplies a chemical solution for chemically etching a semiconductor layer of the semiconductor substrate held by the holder from the nozzle to the semiconductor layer while an entire surface of the semiconductor layer is exposed;

a film thickness measurement device which measures a film thickness of the semiconductor layer; and a control unit which ends a process of chemically etching the semiconductor layer on the basis of a measurement result from the film thickness measurement device.

According to another aspect of the present invention, the foregoing object is attained by providing a substrate manufacturing method comprising steps of:

forming a semiconductor substrate;

chemically etching a semiconductor layer of the semiconductor substrate by supplying a chemical solution to the semiconductor layer;

measuring a film thickness of the semiconductor layer; and ending a process of chemically etching the semiconductor layer when the film thickness measured in the measurement step has a predetermined value.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 12 is a table comparing the rms values of the surfaces of SOI substrates obtained after thinning i.e., after a thinning step for each atomic layer, after oxide film etching, and after etching using SC-1, according to the present invention;

FIG. 13 shows results obtained by measuring the film thickness distribution of an SOI layer at 17 in-plane points of an SOI substrate before and after thinning the SOI layer by 40 nm per atomic layer;

FIG. 14 is a table showing results of measuring the thicknesses of SOI layers before and after thinning;

FIG. 16A is a sectional view of the schematic arrangement of a substrate processing apparatus according to another preferred embodiment of the present invention;

DETAILED DESCRIPTION OF THE PREFERRED EMBODIMENTS

Preferred embodiments of the present invention will be described below with reference to the accompanying drawings.

Figure 1:
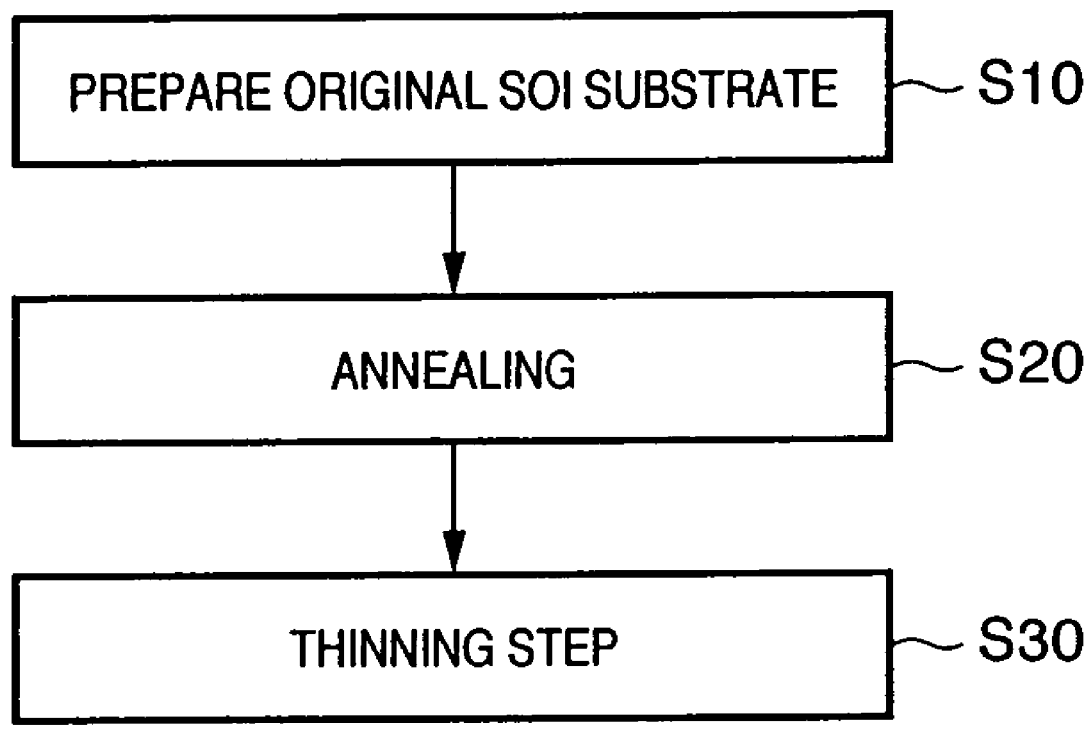
FIG. 1 is a flowchart schematically showing an SOI substrate manufacturing method according to a preferred embodiment of the present invention.

FIG. 1 is a flowchart schematically showing an SOI substrate manufacturing method according to a preferred embodiment of the present invention. In this manufacturing method, an original SOI substrate is first prepared in preparation step S10. An original SOI substrate is defined as an SOI substrate before the thickness of an SOI layer (Si layer) is adjusted in thinning step S30. Original SOI substrates can be manufactured by various methods such as ELTRAN (registered trademark), Smart Cut (registered trademark), SIMOX, and the like. Note that a support member which supports a buried insulating layer in the SOI substrate may take any form. The support member is typically a substrate such as an Si substrate but may be a member of, e.g., plastic or glass. More specifically, the SOI substrate can be considered as a structure which has an Si layer on an insulating layer and extends in a planar direction.

Then, in annealing step S20, the original SOI substrate is annealed in a reduction atmosphere of hydrogen, a mixture of hydrogen and a rare gas, or the like. With this operation, the surface of an SOI layer is planarized.

In thinning step S30, a unit thinning step which uses a predetermined thickness substantially not more than that of one lattice (the thickness of one to several atomic layers) is performed at least once, thereby thinning the SOI layer of the original SOI substrate to a desired film thickness (target film thickness). The unit thinning step includes an oxidation step of oxidizing the surface of the SOI layer of the SOI substrate by the predetermined thickness not more than that of one lattice and a removal step of selectively removing silicon oxide formed in the oxidation step. In thinning step S30, the unit thinning step is typically repeated a plurality of number of times until the SOI layer is adjusted to have the desired film thickness. If the SOI layer can be adjusted to have the desired thickness by only one unit thinning step, the unit thinning step is performed only once. The thinning amount in each unit thinning step preferably corresponds to the thickness of substantially one silicon lattice. However, the SOI layer may be adjusted to have a thickness smaller than that of one lattice.

A preparation step (S10), annealing step (S20), and thinning step (S30) of an original SOI substrate will be described sequentially.

First, the original SOI substrate preparation step (S10) will be described. To prepare, form, or manufacture an original SOI substrate, ELTRAN (registered trademark), Smart Cut (registered trademark), SIMOX, or the like can be adopted. Examples using ELTRAN (registered trademark) and Smart Cut (registered trademark) will be described here.

A method of forming an original SOI substrate using ELTRAN (registered trademark) will be illustrated with reference to FIGS. 2A to 2C.

Figure 2A:
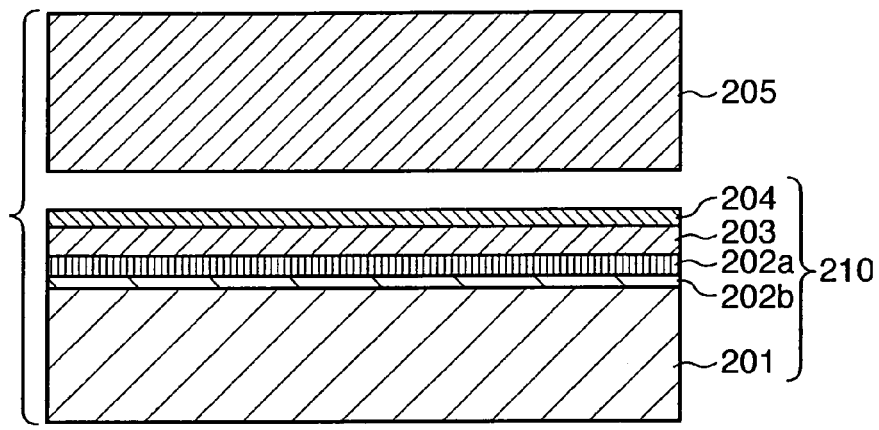
FIGS. 2A to 2C are views showing a method of forming an original SOI substrate by ELTRAN (registered trademark)

In the step shown in FIG. 2A, a $p^+$-type single-crystal Si substrate (e.g., 0.01 to 0.02 Ωcm) 201 is prepared. The substrate 201 is sometimes called a seed substrate or seed wafer. A porous Si layer 202 (202a and 202b) having a single-layer structure or multilayered structure is formed on the upper surface of the substrate 201 by anodization. Anodization refers to etching reaction of silicon. This reaction occurs on a silicon surface facing the negative electrode of a pair of electrodes in a hydrofluoric acid (HF) solution when a substrate is dipped between the electrodes, and a direct current is supplied to the substrate. The etching occurs so as to form a "honeycomb"-like structure and results in a porous structure. In the anodization step, the porous structure can be changed by changing a current to be applied. For example, changing the current during the anodization reaction makes it possible to form porous Si layers 202a and 202b having different structures (e.g., porosities). An epitaxial Si layer 203 is grown on the surface of the porous Si layer (insulating layer) 202a, and the surface layer of the epitaxial Si layer (single-crystal Si layer) 203 is oxidized to form an epitaxial oxide layer 204. In this manner, a first substrate 210 in which the single-crystal Si layer and insulating layer 204 are formed on the porous Si layer 202 is obtained. The single-crystal Si layer 203 is to serve as an SOI layer.

The first substrate 210 and a second substrate 205 are washed separately, and their surfaces are bonded together to form a bonded substrate stack. The second substrate 205 is sometimes called a handle substrate or handle wafer. As the second substrate 205, e.g., an Si substrate is employed. In forming the bonded substrate stack, typically, the first substrate 210 and second substrate 205 are bonded together, and annealing is performed at 900 to 1100° C. to increase the bonding strength of the bonding surface.

Figure 2B:
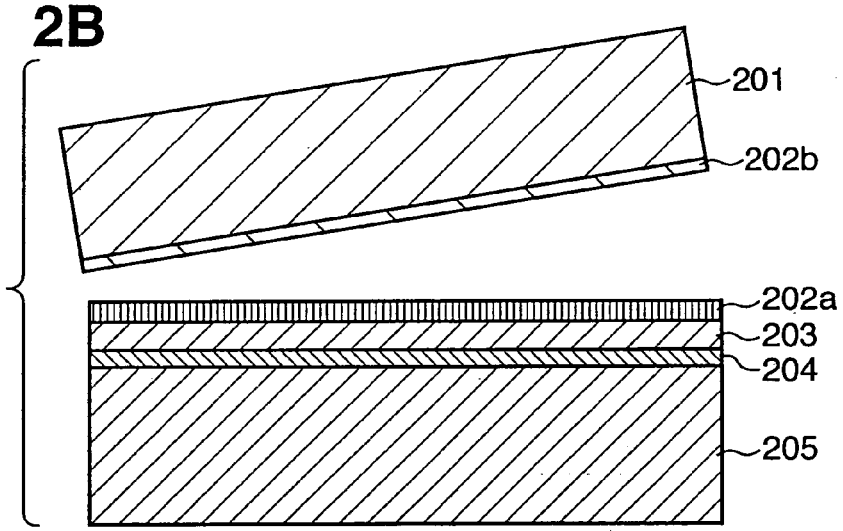

In the step shown in FIG. 2B, the seed substrate 201 is removed from the bonded substrate stack. With this step, the single-crystal Si layer 203 and insulating layer 204 formed on the seed substrate 201 are transferred onto the handle substrate 205. To remove the seed substrate 201 from the bonded substrate stack, a method of dividing the bonded substrate stack at the porous Si layer 202 is preferably employed. This division can be implemented by, e.g., inserting a wedge into the porous Si layer 202 or its vicinity, injecting a fluid to the porous Si layer 202 or its vicinity, or the like. Application of such an external force to the porous Si layer 202 or its vicinity causes cleavage separation near the interface between the first porous Si layer 202a and the second porous Si layer 202b, as schematically shown in FIG. 2B.

Typically, all or part of the porous Si layer 202a remains on the surface of the second substrate 205 having undergone separation or division and thus needs to be selectively removed. The residual porous Si layer 202a-can be removed by etching using, e.g., a solution containing hydrofluoric acid and a hydrogen peroxide solution.

Figure 2C:
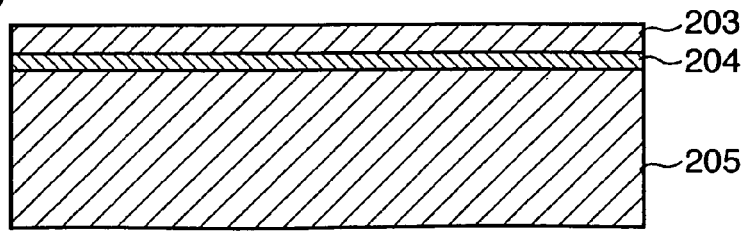

With this step, an original SOI substrate as schematically shown in FIG. 2C is obtained. The original SOI substrate has the single-crystal Si layer 203 serving as an SOI layer on the insulating layer 204 serving as a buried insulating layer. Note that in this state, the SOI layer has roughness on the surface.

A method of forming an original SOI substrate using Smart Cut (registered trademark) will be illustrated with reference to FIGS. 3A to 3C.

Figure 3A:
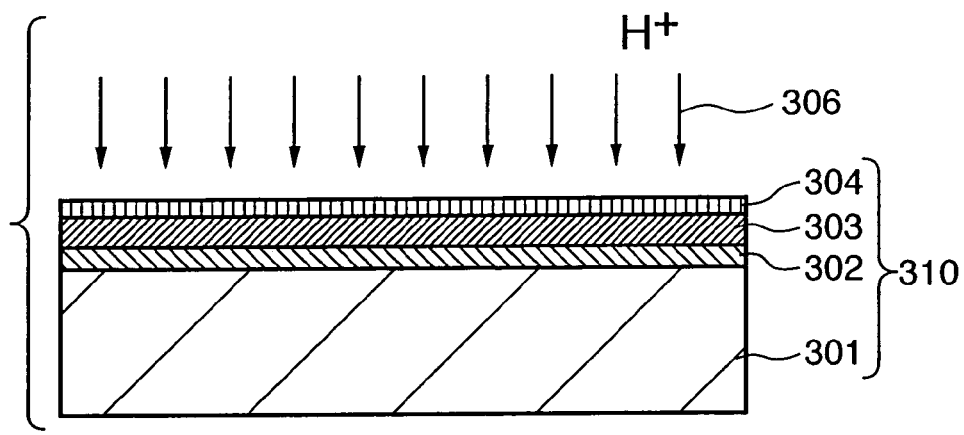
FIGS. 3A to 3C are views showing a method of forming an original SOI substrate by Smart Cut (registered trademark)

In the step shown in FIG. 3A, a single-crystal Si substrate 301 which has an oxide film 304 on its surface is prepared. Hydrogen ions 306 are implanted in the substrate 301 through the surface. If the acceleration energy of the ions are appropriately controlled at this time, a microcavity layer (ion-implanted layer) 302 is formed at a target depth of the Si substrate 301. In this step, the surface layer of the Si substrate 301 becomes a single-crystal Si layer 303. In this manner, a first substrate 310 which has the single-crystal Si layer 303 and an insulating layer 304 on the microcavity layer 302 is obtained. In this method, the single-crystal Si layer 303 is to serve as an SOI layer.

Figure 3B:
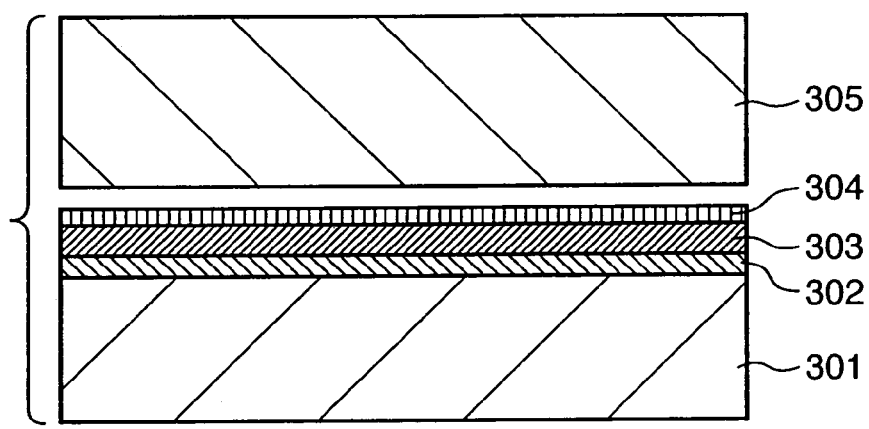

In the step shown in FIG. 3B, the first substrate 310 and a second substrate 305 are washed separately, and their surfaces are bonded together to form a bonded substrate stack. The second substrate 305 is sometimes called a handle substrate or handle wafer. As the second substrate 305, e.g., an Si substrate is employed.

The bonded substrate stack is annealed at a temperature of 450 to 550° C. to cause cleavage separation at the microcavity layer 302. With this operation, the side of the second substrate 305 has an SOI structure as schematically shown in FIG. 3C. Note that in this state, a trace of the microcavity layer 302 remains as roughness on the surface.

An original SOI substrate obtained by the above-mentioned manufacturing methods has relatively large roughness on the surface. The presence of such roughness may cause the following problems in, e.g., determining a thin SOI layer with a thickness of about several ten nm at a stage of forming a single-crystal Si layer on a porous SI layer or at a stage of forming a microcavity layer (ion-implanted layer).

Figure 4:
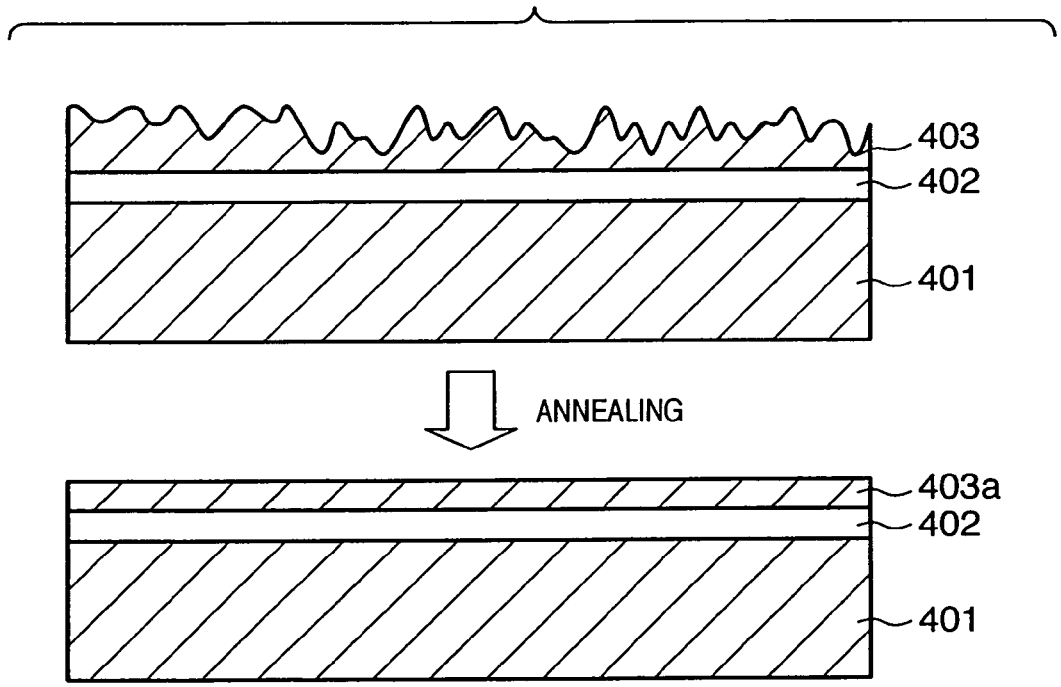
FIG. 4 is a view schematically showing the states before and after annealing when the thickness of an SOI layer on an insulating layer is sufficiently large.

The problems will be described with reference to FIGS. 4 and 5. Both in ELTRAN (registered trademark) and Smart Cut (registered trademark), if an SOI layer with a thickness of several ten nm or less has a surface roughness almost as deep as its thickness, the roughness itself can cause a film defect such as a pore. FIG. 4 schematically shows a case wherein an SOI layer 403 on an insulating layer 402 is sufficiently thick (e.g., 100 nm or more). In this case, the SOI layer 403 can be planarized without any defect by annealing an SOI substrate in a reduction atmosphere.

Figure 5:
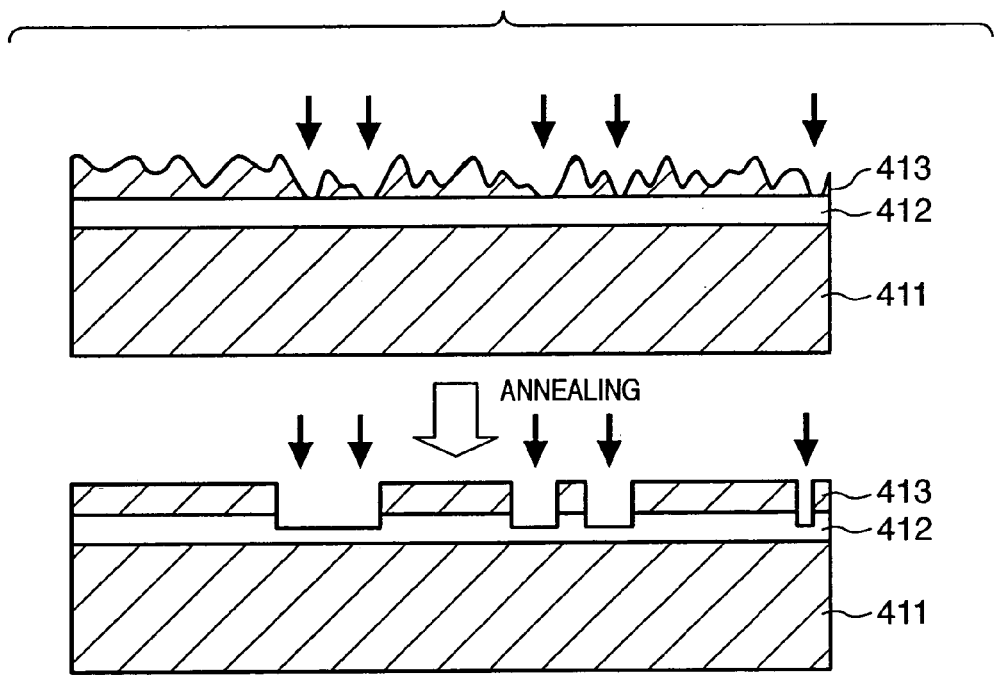
FIG. 5 is a view schematically showing the states before and after annealing when the thickness of an SOI layer on an insulating layer is small.

FIG. 5 schematically shows a case wherein the roughness of an SOI layer 413 on an insulating layer 412 is almost as large as that of the example shown in FIG. 4, and the thickness of the SOI layer 413 is very small (e.g., several ten nm). In this case, when an SOI substrate is annealed in a reduction atmosphere, a pore (pit) may appear. Note that in FIG. 5, regions in which pores appear are indicated by arrows. If the SOI layer is thick (e.g., 100 nm or more), no defect appears in each region indicated by the corresponding arrow. On the other hand, if the SOI layer is thin (e.g., several ten nm), a defect may appear. When annealing is performed in the reduction atmosphere, the silicon (413) and silicon oxide film (412) produce the following reaction:

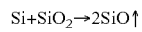

$$Si+SiO_2 \rightarrow 2SiO\uparrow$$

and disappear to form a pore (pit), in the regions (regions indicated by the arrows) where the thickness of the SOI layer 413 is locally small.

Under the circumstances, the present inventors have found a method of forming an original SOI substrate which has an SOI layer with a thickness larger than a target film thickness (S10), annealing the original SOI substrate in a reduction atmosphere (S20), and then thinning the SOI layer of the original SOI substrate to the target film thickness (S30). The annealing of the original SOI substrate in the reduction atmosphere before the thinning of the SOI layer is not an essential step. However, planarization of the surface of the SOI layer by this annealing makes it possible to obtain a final SOI substrate which has high planarity. This is because the surface planarity of the SOI layer is almost completely maintained before the thinning, and in this state, the SOI layer is thinned in thinning step S30 (to be described later).

The thickness of the SOI layer to be formed in the original SOI substrate formation step (S10) can be determined to be large enough to prevent any defect such as a pore as described above in the annealing step (S20) and thinning step (S30). For example, the thickness can be determined to be much larger than the amplitude (peak/valley) of the surface roughness in the original SOI substrate. Increasing the thickness of the SOI layer to be formed in the original SOI substrate preparation step (S10) increases an amount to be thinned in the thinning step (S30). For this reason, the thickness of the SOI layer to be formed in the preparation step (S10) should be reduced within the range of not causing any defect such as a pore.

A combination of the annealing (S20) of the original SOI substrate in the reduction atmosphere with the subsequent thinning step (S30) which uses as a unit a predetermined thickness not more than that of one lattice produces an excellent effect. The thinning step uses as the unit the predetermined thickness not more than that of one lattice proceeds while faithfully maintaining the surface planarity of the original SOI substrate. If the surface planarity of the original SOI substrate is poor, the poor planarity is maintained in the thinning step (S30). After the thinning proceeds to some extent, a defect such as a pore or the like may appear in the SOI layer. In thinning the original SOI substrate whose surface planarity is increased by the annealing, the SOI layer is thinned while maintaining the high surface planarity. Accordingly, a possibility that a defect may appear in the thinning step can be minimized.

As the reduction atmosphere for the annealing (S20), e.g., a) 100% of hydrogen, b) a gas mixture of hydrogen and a rare gas, or the like is preferable. The temperature for the annealing (S20) is preferably about 900° C. or more. When the temperature falls within this range, planarization of the SOI layer occurs. The silicon surface planarized in the reduction atmosphere has smoothness at an atomic layer level.

If the target film thickness of a final SOI layer is set at 20 nm, the thickness of the SOI layer of the original SOI substrate to be subjected to the annealing step (S20) is preferably 20 nm or more, and more preferably, 30 nm or more.

Figure 6:
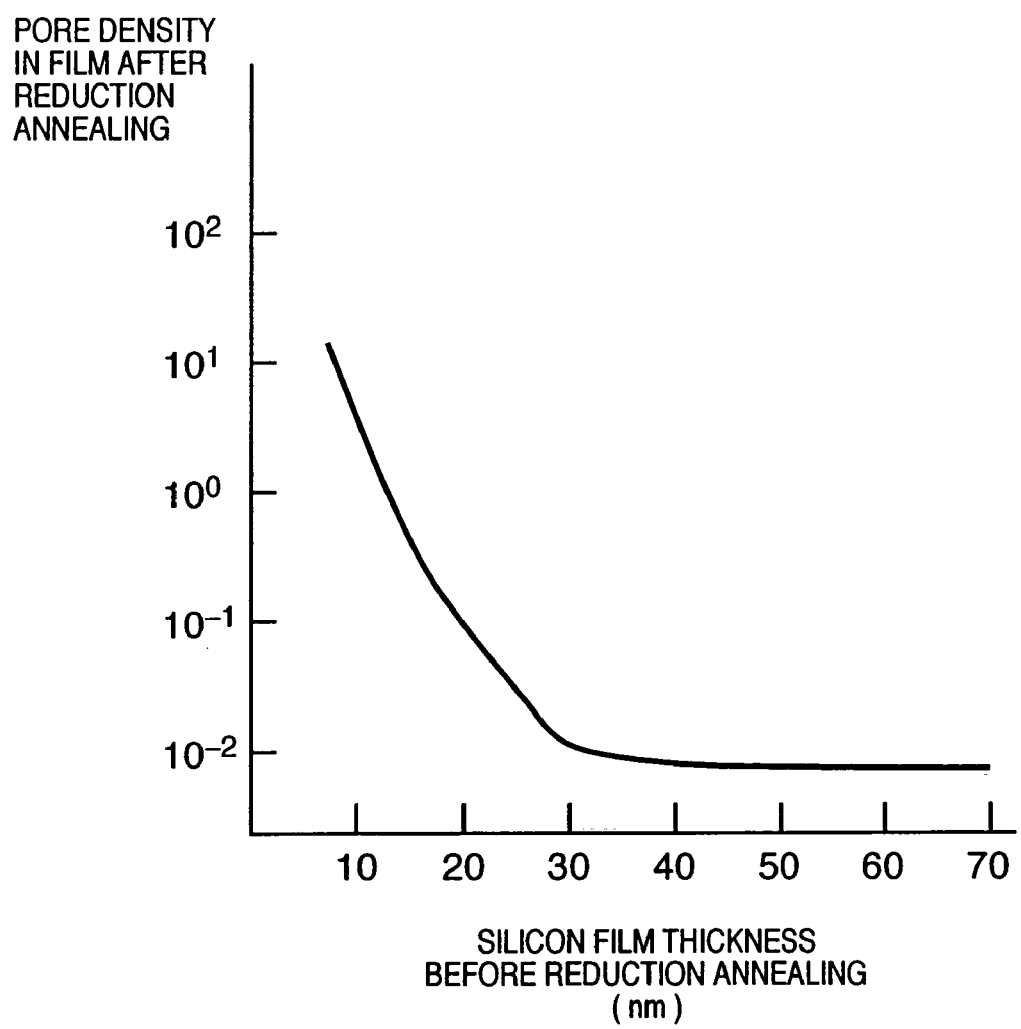
FIG. 6 is a graph of the film defect (hole) density after an annealing step in a reduction atmosphere with respect to the thickness of the SOI layer (Si layer) of the original SOI substrate before the annealing step.

FIG. 6 is a graph showing the film defect (pore) density after the annealing step (S20) in the reduction atmosphere with respect to the film thickness of the SOI layer (Si layer) of the original SOI substrate before the annealing step (S20). According to this graph, when the film thickness of the SOI layer before the annealing step (S20) falls short of 30 nm, the number of defects rapidly increases after the annealing step. When the film thickness falls short of 20 nm, the film defect density exceeds a tolerance. For this reason, the original SOI substrate which has the SOI layer with a film thickness of 30 nm or more has a great advantage. The pore density in the SOI layer after the annealing greatly depends on the surface roughness of the original SOI substrate before the annealing. In consideration of the process stability, the SOI layer of the original SOI substrate may need to be 40 nm or more. The original SOI substrate which has the SOI layer with a thickness of 50 nm or more increase the burden on the thinning step (S30) for obtaining an extra-thin (e.g., 20 nm or less) final SOI layer. Thus, it is not preferable in terms of mass production.

The thinning step (S30) will be described next. This thinning step thins the SOI layer of the original SOI substrate whose surface has been planarized after the annealing, in units of a predetermined thickness (e.g., the thickness of one to several atomic layers). The thinning in units of the predetermined thickness can be implemented by repeating a unit thinning step of thinning the SOI layer by a predetermined thickness not more than that of one lattice until the SOI layer is reduced to a desired film thickness.

Figure 7:
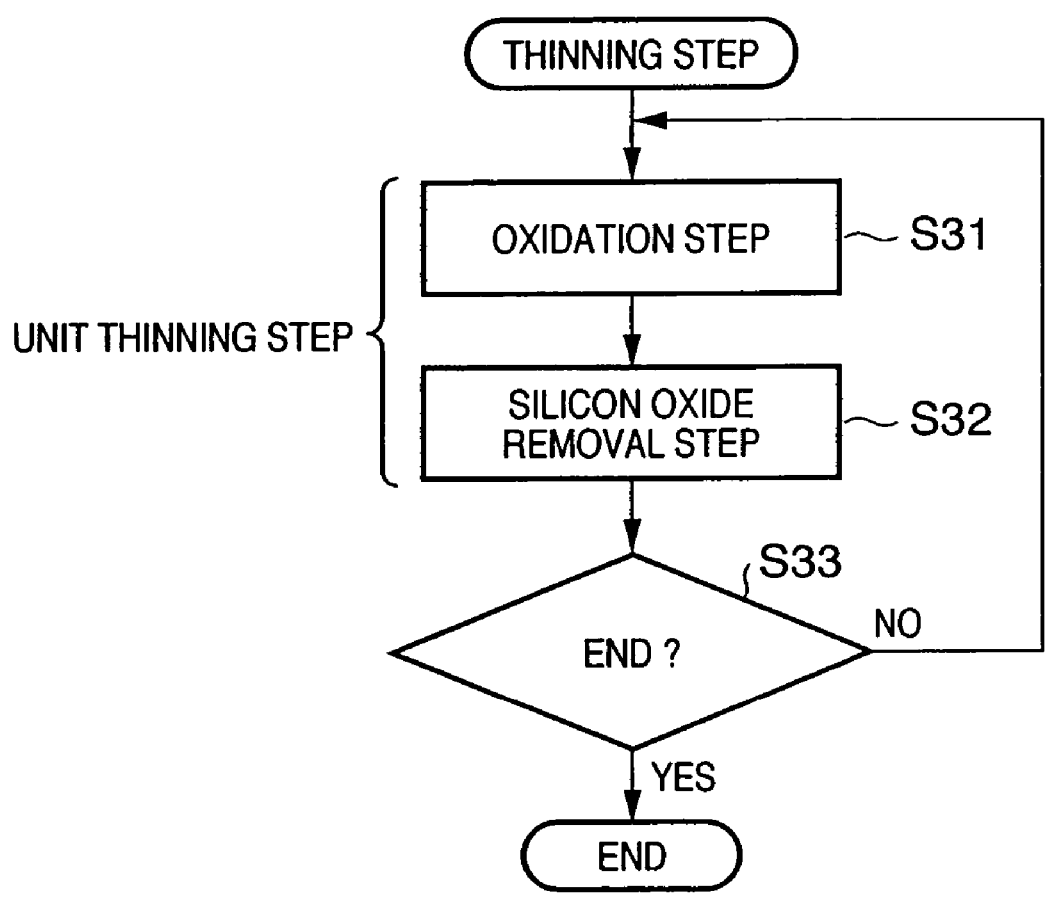
FIG. 7 is a flowchart showing a thinning step in detail.

FIG. 7 is a flowchart showing in detail the thinning step (S30). The thinning step (S30) repeats the unit thinning step which includes an oxidation step (S31) of oxidizing silicon on the surface of the SOI layer by the predetermined thickness not more than that of one lattice and a removal step (S32) of selectively removing (etching) the silicon oxide formed in the oxidation step until the SOI layer is reduced to the desired film thickness (YES in step S33).

To guarantee to obtain the SOI layer with the target film thickness, the following method is preferable. More specifically, the film thickness of the SOI layer is measured before the thinning step or during the thinning step. Then, the repetition (e.g., the required repetition count, the remaining repetition count, or the end of repetition) of the unit thinning step is controlled on the basis of a difference between the measurement value and the target film thickness and a reduction in film thickness by one unit thinning step.

As a comparative example of the thinning step in units of the predetermined thickness not more than that of one lattice, consider an example wherein the SOI layer of the SOI substrate after the annealing is thinned at once by sacrificial oxidation (thermal oxidation and subsequent etching of thermal silicon oxide) or hydrofluoric acid or an alkali. Such a method can make rougher the surface of the SOI substrate having once been planarized by the annealing (S20) in the reduction atmosphere.

For example, the surface roughness of the SOI layer after the annealing in the reduction atmosphere is measured by an atomic force microscope (AFM). The rms value in a measurement region of 1 μm×1 μm is about 0.09 nm. The SOI layer is washed with a solution mixture (so-called SC-1 solution) of ammonia, a hydrogen peroxide solution, and water at 80° C. A silicon film is etched at a rate of about 0.4 nm/min (the rate depends on the concentration of ammonia). Ten-min washing etches the silicon film by about 4 nm, and the surface roughness of the SOI layer is measured. The rms value in the region of 1 μm×1 μm degrades to about 0.15 nm. This value is almost equal to that of a polished surface. For the present, the planarity does not pose a problem, but is much poorer than the planarity obtained by the annealing in the reduction atmosphere.

The method of assuming oxidation of silicon by the predetermined thickness not more than that of one lattice and removal of the resultant silicon oxide as one cycle (one unit thinning step) and repeating the cycle, as shown in FIG. 7, almost completely maintains the surface planarity of the SOI layer before the thinning. This will be compared with the above-mentioned comparative example. With the thinning step in units of the predetermined thickness not more than that of one lattice, if the rms value before the thinning is 0.09 nm, the rms value after the thinning becomes 0.09 to 0.10 nm. The planarity hardly degrades.

To implement the oxidation (S31) by the predetermined thickness of one to several atomic layers, e.g., a method of dipping the SOI substrate (or its surface) in an acidic liquid (liquid oxidizing agent) and a method of exposing the SOI substrate (or its surface) to the steam of an acidic liquid (gas oxidizing agent) are preferable. A method of dipping the SOI substrate in a liquid is preferably performed at room temperature. Since a heated acidic liquid may vary the thickness by which the SOI layer is oxidized, it is not preferable. Thermal oxidation in an atmosphere containing oxygen cannot control oxidation by the predetermined thickness not more than that of one lattice, and thus cannot be applied to the unit thinning step. As the acidic liquid (liquid oxidizing agent), a neutral liquid such as ozone water, an acescent liquid such as a hydrogen peroxide solution, a strong acid liquid such as nitric acid, hydrochloric acid or sulfuric acid, or the like is preferable. The steam of a strong acid liquid can perform oxidation by the predetermined thickness not more than that of one lattice even at room temperature. The oxidation by the predetermined thickness not more than that of one lattice can be implemented by oxidizing the SOI layer in an atmosphere where the supply oxygen amount is adjusted such that the surface of the SOI layer is oxidized only by the predetermined thickness not more than that of one lattice. The oxidation by the predetermined thickness not more than that of one lattice can also be implemented by exposing the SOI layer to an atmosphere containing oxygen or ozone (gas oxidizing agent) and irradiating the surface of the SOI layer with ultraviolet rays.

To selectively remove an oxide film (S32), etching using a hydrofluoric acid (HF) solution is preferable. In addition to this, plasma etching or reactive ion etching can be employed.

In oxidation step S31, when an oxide film formed on the surface of the SOI layer is to be etched using an HF solution, the oxide film is preferably completely removed. This is because if a part of the oxide film remains unetched, the surface roughness of the SOI layer increases. Particularly, in repeating the unit thinning step, the surface roughness of the SOI layer increases with each repetition of the unit thinning step.

When the oxide film formed on the surface of the SOI layer is to be etched using the HF solution in the oxidation step S31, an oxidizing agent (e.g., a liquid oxidizing agent or gas oxidizing agent) used in oxidation step S31 is preferably completely removed from the SOI substrate to be processed. Since the oxidizing agent and HF solution used in oxidation step S31 coexist on the SOI substrate to be processed, and their mixing ratio becomes nonuniform on the surface of the SOI substrate to be processed, the in-plane uniformity of the SOI substrate to be processed decreases. In repeating the unit thinning step, the surface roughness of the SOI layer increases with each repetition of the unit thinning step.

Since the size of the SOI substrate to be processed is 300 mm or more, degradation in in-plane uniformity due to the residual oxide film and oxidizing agent typically occurs. For this reason, the oxidizing agent should completely be removed prior to the etching of the oxide film in each cycle, and the oxide film should completely be removed by the subsequent etching.

The lattice spacing of the (100) plane of single-crystal silicon is 0.543 nm, and the distance between atomic layers is 0.543/4=about 0.135 nm. Actually, the thickness of the SOI layer was measured with an ellipsometer while performing the thinning step (S30) so adjusted to use the thickness of one lattice as a unit. It was confirmed that one unit thinning step reduced the film thickness by 0.60 nm. As can be seen from this example, control of oxidation and etching in units of the thickness of substantially four atomic layers, i.e., one lattice is performed with extremely high accuracy and good repeatability. That is, in thinning in units of the thickness of substantially one lattice, the thinning amount does not depend on parameters such as the temperature, the concentration of a chemical solution, and the like.

The above-mentioned thinning of the SOI layer in units of one lattice is extremely useful in obtaining an SOI layer with the target film thickness. The above-mentioned example can adjust the film thickness of the SOI layer extremely precisely, i.e., every 0.60 nm. Also, in thinning in units of the thickness of less than one lattice, the unit for thinning is further smaller, and the thickness of the SOI layer can be controlled at further high precision.

An example of a method of manufacturing the above-mentioned extra-thin SOI substrate, and an apparatus suitable for the manufacturing method will be described below.

Figure 8:
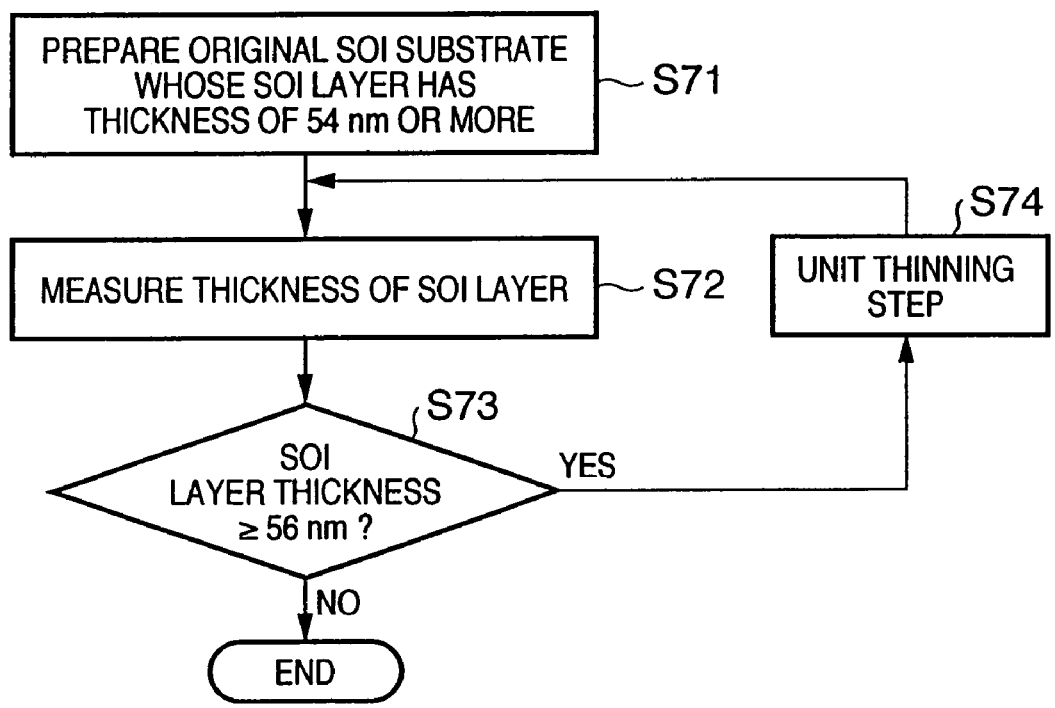
FIG. 8 is a flowchart showing a method of manufacturing an extra-thin film SOI substrate according to the first embodiment of the present invention.

FIG. 8 is a flowchart showing an extra-thin SOI substrate manufacturing method according to the first embodiment of the present invention. An example will be described wherein an SOI substrate has an SOI layer with a thickness of 55±1 nm.

In preparation step S71, an original SOI substrate is prepared. The original SOI substrate may be one formed in the step described as S10 in FIG. 1 (one not annealed in a reduction atmosphere). The original SOI substrate is preferably one formed in the steps as S10 and S20 in FIG. 1 (one annealed in the reduction atmosphere).

As for an original SOI substrate which is manufactured by ELTRAN (registered trademark), Smart Cut (registered trademark), SIMOX, or the like, process variations between an epitaxial growth step and an ion implantation step can cause variations (the variation range is about ±5 nm) between substrates in SOI layer film thickness.

The example described here has as its object to finally (after thinning) obtain an SOI layer with a thickness of 55 nm (±1 nm). A target value of the thickness of an SOI layer should be determined so as to prevent the thickness of the SOI layer from falling below 54 nm even if the thickness of the SOI layer varies due to process variations. For example, if a process variation range is assumed to be ±5 nm, the target film thickness of the SOI layer of an original SOI substrate to be prepared should be 59 nm or more. In this case, the SOI layer of the original SOI substrate is manufactured to have a thickness of at least 54 nm.

This example is a mere application for a deeper understanding of the present invention. In the present invention, the thickness of the SOI layer of an original SOI substrate and that of the SOI layer after the thinning can arbitrarily be determined. For example, an original SOI substrate which has an SOI layer with a thickness of about 100 nm may be prepared, and the SOI layer may be thinned to about 55 nm. Alternatively, an original SOI substrate which has an SOI layer with a thickness of about 55 nm may be prepared, and the SOI layer may be thinned to 20 nm.

In film thickness measurement step S72, the thickness of an SOI layer is measured. This measurement can be performed using, e.g., an optical interference type thickness-meter in a nondestructive and noncontact manner.

In determination step S73, a measurement value obtained in film thickness measurement step S72 is compared with a determination reference value (in this example, 55+1=56 nm). If it is determined by the comparison that the measurement value is equal to or more than the determination reference value, unit thinning step S74 needs to be performed at least once. Then, the process advances to unit thinning step S74. On the other hand, if the measurement value is less than the reference value, the thickness of the SOI layer falls within the tolerance (in this example, 55±1 nm) of a final target film thickness, and the process ends.

Determination step S73 may be performed manually or may automatically be performed by a determination unit whose reference value is predetermined.

Figure 9:
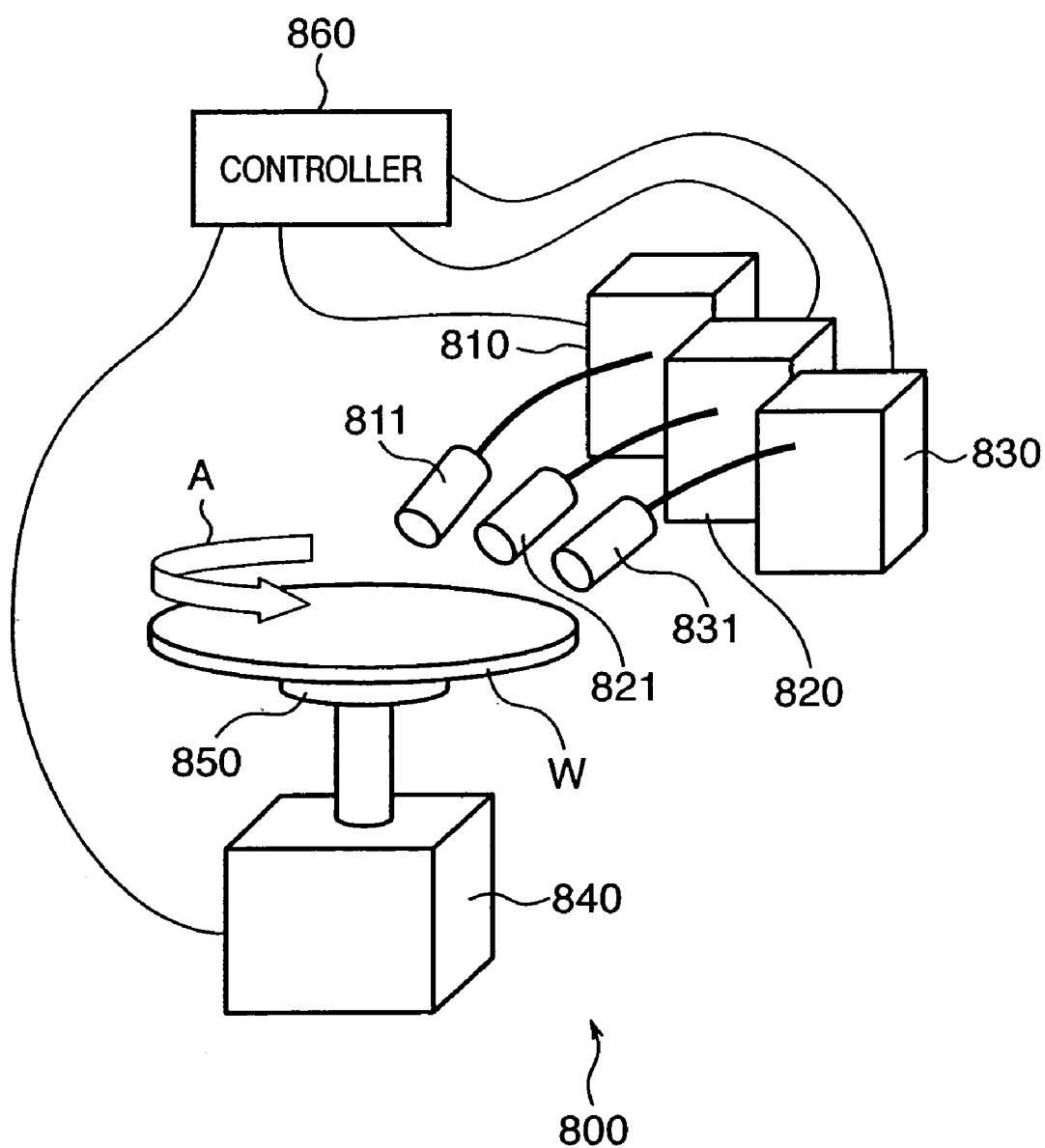
FIG. 9 is a view schematically showing the arrangement of a single-wafer processing apparatus suitable for a unit thinning step.

Unit thinning step S74 is a step of thinning an SOI layer by a predetermined thickness not more than that of one lattice and includes oxidation step S31 and silicon oxide removal step S32 described with reference to FIG. 7, both of which use as a unit the predetermined thickness not more than that of one lattice. FIG. 9 is a view schematically showing the arrangement of a single-wafer processing apparatus (single-wafer film thickness adjustment apparatus) suitable for unit thinning step S74. To separately adjust the SOI layers of original SOI substrates, a single-wafer processing apparatus is preferable. A batch type processing apparatus can also be used. In this case, the following operation needs to be performed. More specifically, the thicknesses of the SOI layers of a plurality of original SOI substrates are measured, the original SOI substrates are classified into groups on the basis of the measurement results, and processing is performed for each group.

The arrangement of a single-wafer processing apparatus 800 shown in FIG. 9 and the unit thinning step using the apparatus will be described below. The processing apparatus 800 comprises a holder (wafer chuck) 850 which holds an SOI substrate W and a rotation mechanism 840 which rotates the holder, and can rotate the SOI substrate W. The processing apparatus 800 also comprises a first nozzle 811, second nozzle 821, and third nozzle 831 which supply ozone water, a hydrofluoric acid solution, and pure water, respectively, to the SOI substrate W held on the holder 850. An ozone water supply unit 810 is connected to the first nozzle 811; a hydrofluoric acid supply unit 820, the second nozzle 821; and a pure water supply unit 830, the third nozzle 831. The rotation mechanism 840 and supply units 810, 820, and 830 are controlled by a controller 860. The controller 860 controls execution of unit thinning step S74 by operating the rotation mechanism 840 and supply units 810, 820, and 830 in accordance with a predetermined program (processing recipe).

The SOI substrate W is placed on the holder 850 by, e.g., a transport mechanism (not shown). When the SOI substrate W is placed on the holder 850, the rotation mechanism 840 rotates the SOI substrate W in a direction indicated by an arrow A in accordance with a command from the controller 860. The rotational speed is typically about 800 to 1,000 rpm.

Ozone water is supplied from the ozone water supply unit 810 through the first nozzle 811 to the surface of the SOI substrate W under the control of the controller 860, in order to perform a step of oxidizing a unit layer on the surface of an SOI layer (unit layer oxidation step S31). The ozone concentration of the ozone water is preferably, e.g., 10 ppm. The supply time for the ozone water is preferably, e.g., about 20 sec. With this process, silicon of the surface of the SOI substrate W is oxidized by the predetermined thickness not more than that of one lattice to form a silicon oxide layer. After the set supply time has elapsed, the ozone water supply unit 810 stops supplying the ozone water under the control of the controller 860.

The hydrofluoric acid supply unit 820 supplies a hydrofluoric acid solution through the second nozzle 821 to the surface of the SOI substrate W under the control of the controller 860, in order to perform a step of removing (etching) the silicon oxide layer formed by the ozone water (silicon oxide layer removal step S32). The concentration of hydrogen fluoride is preferably, e.g., 1.5%, and the supply time for the hydrofluoric acid solution is preferably, e.g., about 15 sec. With this process, the silicon oxide layer on the surface of the SOI substrate W is etched. More specifically, the SOI layer is thinned by the predetermined thickness not more than that of one lattice through oxidation of silicon by the predetermined thickness not more than that of one lattice and etching of the resultant silicon oxide. After the set supply time has elapsed, the hydrofluoric acid supply unit 820 stops supplying the hydrofluoric acid solution under the control of the controller 860.

The pure water supply unit 830 supplies pure water through the third nozzle 831 to the SOI substrate W under the control of the controller 860, in order to remove the chemical solution on the SOI substrate W. The pure water supply unit 830 then stops supplying the pure water under the control of the controller 860. The rotation mechanism 840 increases the rotational speed of the SOI substrate W to about 1,200 rpm and spin-dries the SOI substrate.

In the above-mentioned procedure, the SOI substrate is washed and dried after processing it using hydrofluoric acid. To obtain a hydrophilic surface for, e.g., the prevention of adhesion of a foreign substance, the SOI substrate may be washed and dried after being processed again using the ozone water.

If the determination reference value used in determination step S73 is appropriately changed, SOI layers with various thicknesses other than that described above can be obtained. For example, if the determination reference value in determination step S73 is 51 nm, an SOI layer with a thickness of 50±1 nm can be obtained while if the determination reference value is 6 nm, an SOI layer with a thickness of 5±1 nm can be obtained.

Figure 10:
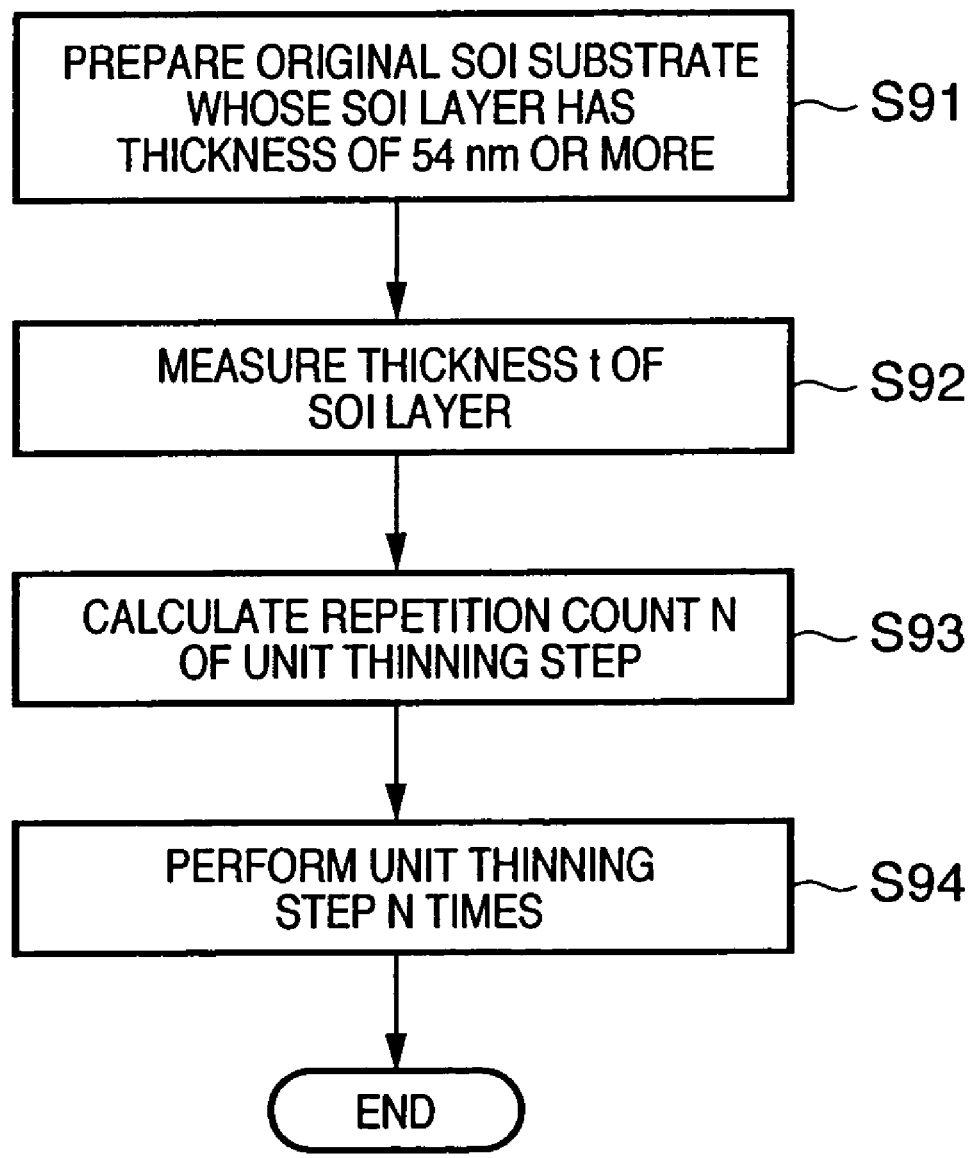
FIG. 10 is a flowchart showing a method of manufacturing an extra-thin film SOI substrate according to the second embodiment of the present invention.

FIG. 10 is a flowchart showing an extra-thin SOI substrate manufacturing method according to the second embodiment of the present invention. An example will also be described here wherein an SOI substrate having an SOI layer with a thickness of 55±1 nm.

In preparation step S91, an original SOI substrate which has an SOI layer with a thickness of 54 nm or more is prepared, as in preparation step S71 of the first embodiment.

In film thickness measurement step S92, a thickness t of the SOI layer is measured. This measurement can be performed using, e.g., an optical interference type thicknessmeter in a nondestructive and noncontact manner.

In number-of-repetition calculation step S93, a repetition count (the number of executions) N of a unit thinning step is calculated on the basis of the measurement value obtained in measurement step S92 and a predetermined final target film thickness (a target film thickness of the SOI layer to be obtained after the thinning step, and in this example, 55 nm) of the SOI layer. The unit thinning step is adjusted such that the thickness of the SOI layer decreases by 0.60 nm (the thickness of one lattice) by one unit thinning step. Hence, the repetition count N can be calculated by equation (1):

$$N = (t - 55)/0.6 \quad (1)$$

where "55" (nm) in equation (1) is the final target film thickness. Assume that the final target film thickness is arbitrarily set. Letting $t_{final}$ be the final target film thickness, the repetition count N can be calculated by equation (2):

$$N = (t - t_{final})/0.6 \quad (2)$$

In thinning step S94, the unit thinning step is repeated N times, thereby thinning the SOI layer to the final target film thickness (in this example, 55±1 nm).

In this embodiment as well, a processing apparatus 800 as shown in FIG. 9 can be used to repeat the unit thinning step. In this case, the following operation is efficient. More specifically, a process comprising oxidation by a thickness of one lattice using ozone water and etching of silicon oxide using a hydrofluoric acid solution is assumed as one cycle (unit thinning step). This cycle is repeated N times, and then washing and drying steps are performed.

The calculation of the repetition count N of the unit thinning step is not strictly defined by equation (1) or (2). A correction term which takes disturbance factors into consideration may be added to equation (1) or (2). Instead of equations, the repetition count N may be calculated on the basis of a table (a table which describes the relationship between the repetition count N of the unit thinning step and the thinning amount) experimentally created in advance.

A combination of a method according to the first embodiment and that according to the second embodiment is also effective. For example, in the second embodiment, the repetition count N of the unit thinning step for thinning the SOI layer with the thickness t (=61 nm) to the final target film thickness is calculated as 10 in accordance with equation (1). If the repetition count N increases, the film thickness of the SOI layer to be finally obtained may deviate from the final target film thickness. The thinning amount by one unit thinning step is estimated as a predetermined value (e.g., 0.6 nm), and an error accumulates every unit thinning step at a high possibility. Under the circumstances, after the unit thinning step is repeated M (M<N) times, the procedure of the first embodiment is performed, which implements higher-precision film thickness adjustment. In this case, the number of times of the film thickness measurement step can be lowered below that of a case wherein film thickness adjustment is performed in accordance with the procedure of the first embodiment from the beginning.

Figure 11:
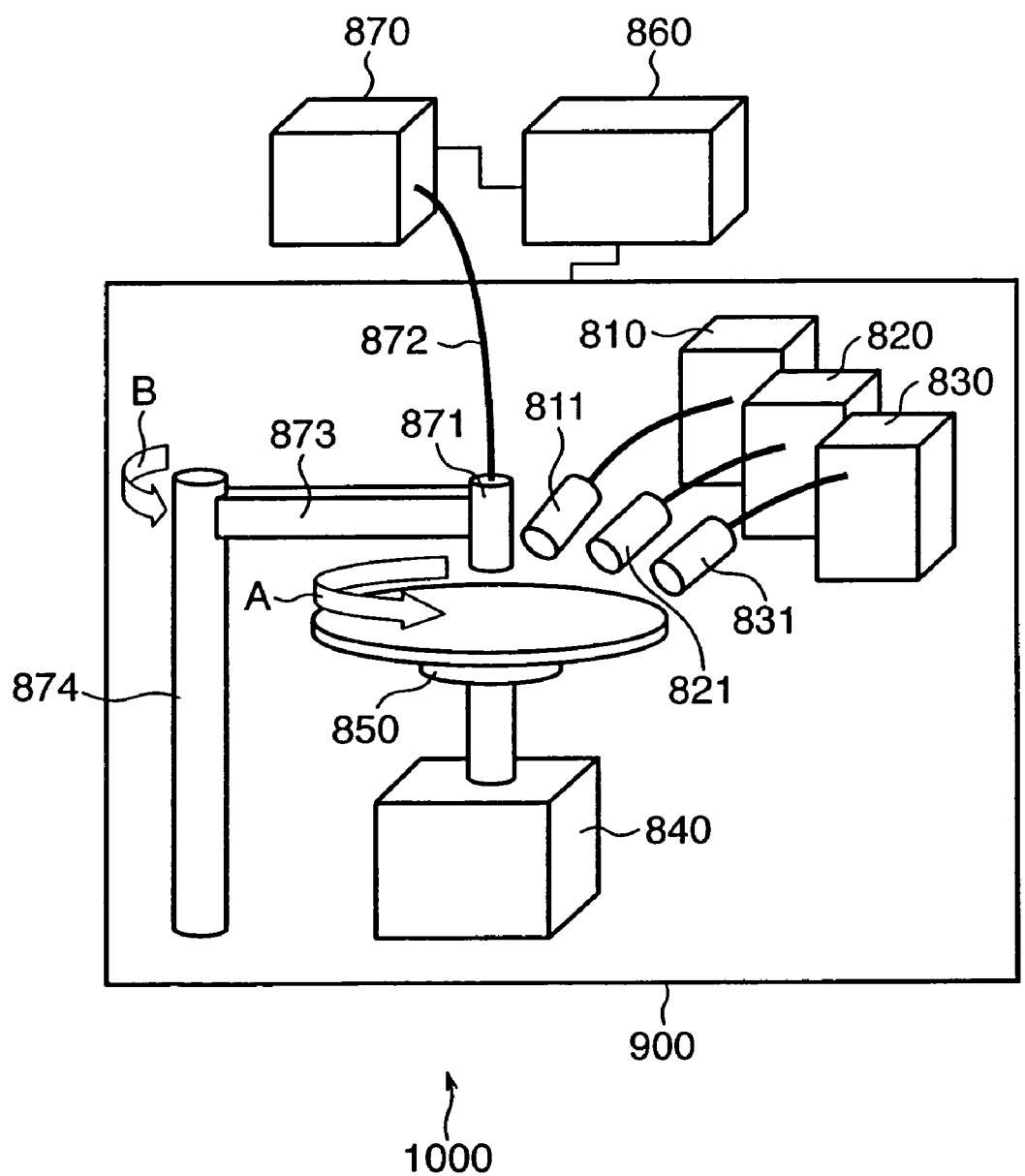
FIG. 11 is a view schematically showing the arrangement of a single-wafer processing apparatus suitable for a unit thinning step.

Another single-wafer processing apparatus (single-wafer film thickness adjustment apparatus) suitable for the present invention will be described with reference to FIG. 11. In FIGS. 9 and 11, the same reference numerals denote the same parts, and a description of the same parts as in FIG. 9 will be omitted or simplified in FIG. 11.

A processing apparatus 1000 incorporates a measurement unit which measures the film thickness of an SOI layer. The measurement unit has a retractable sensor head 871 and film thickness sensor main body 870. The head 871 is connected to the main body 870 through an optical fiber 872. The head 871 is coupled to a turning shaft 874 which is rotatably driven by a driving mechanism (not shown) through a support arm 873.

The film thickness sensor main body 870 incorporates a light source. Light emitted from the light source is guided to the sensor head 871 through the optical fiber 872 and comes incident on an SOI substrate W. Light reflected by the SOI substrate W passes through the sensor head 871 and optical fiber 872 and returns to the film thickness sensor main body 870. Light from the SOI substrate W contains an interference signal generated by the thin silicon film (SOI layer). The film thickness sensor main body 870 converts the interference signal to the film thickness of the SOI layer.

The sensor head 871 is arranged in the vicinity of the surface of the SOI substrate W at the time of film thickness measurement, as schematically shown in FIG. 11. The sensor head 871 is retracted to a retraction position during transport of the SOI substrate W or the thinning step (at the time of oxidation, etching, washing, and drying). In this embodiment, the sensor head 871 is moved by rotating the turning shaft 874 by the driving mechanism (not shown). The sensor head 871, however, may linearly be driven in, e.g., the vertical direction or horizontal direction.

The retraction of the sensor head 871 during the transport of the SOI substrate W or the thinning step (at the time of oxidation, etching, washing, and drying) can prevent any contact between the SOI substrate W and the sensor head 871 in the transport of the SOI substrate W and any adhesion of a chemical solution to the sensor head 871 in oxidation or etching.

A film thickness measurement value obtained by the film thickness measurement unit (film thickness sensor main body 870) is sent to a controller 860. The controller 860 incorporates a control sequence (typically, a control program) for automatically executing the processes shown in S72 to S74 of FIG. 8 or S92 to S94 of FIG. 10. More specifically, the controller 860 is configured as an apparatus which controls the thinning step on the basis of a measurement result of the thickness of the SOI layer or an apparatus which controls the repetition of the unit thinning step on the basis of the measurement result of the thickness of the SOI layer. The controller 860 comprises a unit (e.g., a unit which receives information from an external apparatus through a communication line, an operation panel, or the like) which receives information such as the final target film thickness of the SOI layer and the like.

The controller 860 can typically be arranged by incorporating a control program for controlling the processes shown in S72 to S74 of FIG. 8 or S92 to S94 of FIG. 10 into a computer which comprises a CPU, memory (RAM, hard disk device, or the like), input and output devices (e.g., a keyboard, mouse, display, and network interface) and the like.

The controller 860 and film thickness sensor main body 870 may be incorporated in a housing 900 which accommodates the rotation mechanism 840, ozone water supply units 810, 820, and 830, and the like. Alternatively, the controller 860 and film thickness sensor main body 870 may be spaced apart from the housing 900 and may be connected to the mechanisms in the housing 900 through a communication cable.

As described above, the preferred embodiments of the present invention can, e.g., facilitate control of the thickness of an SOI layer and/or eliminate defect sources of the SOI layer and/or ensure high surface planarity and/or increase the flexibility toward the required specification of the SOI layer.

FIRST EXAMPLE

This example provides a result obtained by comparing a thinning step in units of a predetermined thickness not more than that of one lattice according to the present invention with another method. FIG. 12 is a table comparing the rms values (1 μm□, 2 μm□, 5 μm□, 10 μm□, and 20 μm□) of the surfaces of SOI substrates obtained after thinning, i.e., when a thinning step is performed according to the present invention ("present invention" in FIG. 12), when oxide film etching is performed after thermal oxidation ("after thermal oxidation/oxide film etching" in FIG. 12), and when etching using SC-1 is performed ("after SC-1 etching" in FIG. 12).

With the thinning step in units of the predetermined thickness not more than that of one lattice according to the present invention, the microroughness of a thin film degrades extremely slightly.

EXAMPLE 2

This example provides the film thickness distribution of an SOI layer before and after a thinning step in units of a predetermined thickness not more than that of one lattice according to the present invention.

FIG. 13 shows results obtained by measuring the film thickness distribution of the SOI layer at 17 in-plane points (Position=1 to 17) of an SOI substrate before and after thinning the SOI substrate by 40 nm using the predetermined thickness not more than that of one lattice according to the present invention. With the thinning step according to the present invention, the variation range of the in-plane film thickness of the SOI substrate is kept extremely small even after the thinning.

EXAMPLE 3

This example provides an application of the present invention to ELTRAN (registered trademark).

An original SOI substrate as schematically shown in FIG. 2C was formed using ELTRAN (registered trademark) (S10). The original SOI substrate was so formed as to have an SOI layer 203 with a thickness of 45 nm and a buried oxide film 204 with a thickness of 50 nm. The surface roughness of the original SOI substrate was measured at a 1-μm×1-μm region with an AFM. The resultant rms value was 10.5 nm.

The original SOI substrate was annealed (planarized) at 1,050° C. for 1 hr in a 100% hydrogen atmosphere (S20). The surface roughness of the SOI layer after the planarization was measured at a 1-μm×1-μm region with the AFM. It was confirmed that the surface roughness improved, i.e., the resultant rms value decreased to 0.09 nm. The film thickness of the SOI layer after the planarization was measured with an ellipsometer and was found to be 44 nm.

The original SOI substrate after the planarization was set in a single-wafer processing apparatus 800 shown in FIG. 9. Then, a cycle (unit thinning step) of supplying 10 ppm of ozone water for 10 sec while rotating the original SOI substrate at 500 rpm (oxidation step in units of a predetermined thickness not more than that of one lattice) and supplying a 1.0% hydrofluoric acid solution for 10 sec (silicon oxide layer removal step) was continuously repeated 40 times (S30). As a result, the film thickness of the SOI layer became 20 nm. The rms value was measured at a 1-μm×1-μm region with the AFM and was found to remain 0.09 nm. The range of the film thickness distribution of the entire SOI substrate (maximum value−minimum value) did not change.

The SOI substrate after the thinning was dipped in a concentrated hydrofluoric acid solution for 15 min to enlarge defects. The defect density was observed and measured with a microscope. The density of defects recognized as pores formed in the SOI layer was 0.05 defects/cm. It was confirmed that the SOI substrate had extremely low defect density and good surface planarity.

EXAMPLE 4

This example provides an application of the present invention to Smart Cut (registered trademark).

Figure 3C:
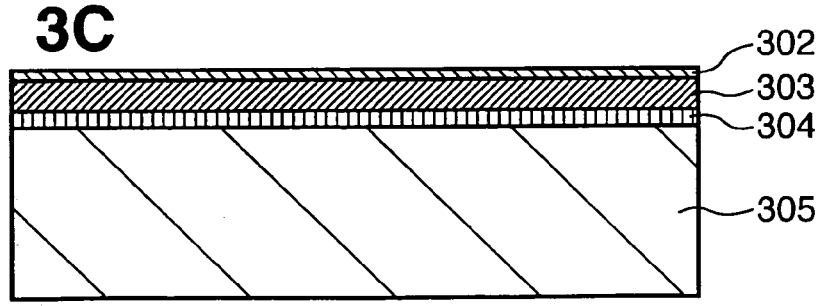

An original SOI substrate as schematically shown in FIG. 3C was formed using Smart Cut (registered trademark) (S10). The original SOI substrate was so formed as to have an SOI layer 303 with a thickness of 145 nm and a buried oxide film 304 with a thickness of 200 nm. The surface roughness of the original SOI substrate was measured at a 1-μm×1-μm region with an AFM. The resultant rms value was 15.0 nm.

To reduce the thickness of the SOI layer of the original SOI substrate to 20 nm, thermal oxidation and etching of the resultant thermal silicon oxide film (so-called sacrificial oxidation) were performed as the first stage process. The thickness of the SOI layer was reduced to 50 nm. The surface roughness after the etching by sacrificial oxidation was 13.5 nm. The original SOI substrate was annealed (i.e., planarized) at 1,000° C. for 3 hrs in a gas mixture of 80% of argon and 20% of hydrogen (S20). As a result, the planarity improved, i.e., the rms value decreased up to 0.10 nm. The film thickness of the SOI layer after the planarization was 50 nm and did not change.

The original SOI substrate after the planarization was set in a single-wafer processing apparatus 800 shown in FIG. 9. Then, a cycle (unit thinning step) of supplying a 5% nitric acid solution for 7 sec (oxidation step in units of a predetermined thickness not more than that of one lattice) while rotating the original SOI substrate at 500 rpm, supplying pure water for 7 sec, and supplying a 1.0% hydrofluoric acid solution for 10 sec (silicon oxide layer removal step) was continuously repeated 50 times (S30). As a result, the film thickness of the SOI layer became 20 nm. The rms value was as good as 0.11 nm.

The SOI substrate after the thinning was dipped in a concentrated hydrofluoric acid solution for 15 min to enlarge defects. The defect density was observed and measured with a microscope. The density of defects recognized as pores formed in the SOI layer was 0.07 defects/cm. It was confirmed that the SOI substrate had extremely low defect density and good surface planarity.

EXAMPLE 5

This example provides an application of the present invention to ELTRAN (registered trademark).

A 300-mmϕ original SOI substrate with as schematically shown in FIG. 2C was prepared using ELTRAN (registered trademark) (S10). The original SOI substrate was annealed in a hydrogen atmosphere under the same conditions as those in Example 3 (S20).

As for the SOI substrate after the annealing, the film thickness of the SOI layer was measured with a commercial optical interference type thicknessmeter. The film thickness was measured at 30 points on the X-axis with respect to the center of the SOI substrate serving as the origin. The mean film thickness was 67.2 nm.

The SOI layer of the SOI substrate was thinned using a commercial wet cleaning apparatus as a single-wafer processing apparatus 800 shown in FIG. 9 (S30).

In a thinning step, a cycle (unit thinning step) of supplying 10 ppm of ozone water for 40 sec (oxidation step in units of a predetermined thickness not more than that of one lattice) while rotating the single-wafer processing apparatus 800 shown in FIG. 9 at 500 rpm and supplying a 0.7% hydrofluoric acid solution for 15 sec (silicon oxide layer removal step) was continuously repeated 96 times (S30). As a result, the thickness of the SOI layer became 21.7 nm. The range of the film thickness distribution of the entire SOI substrate (maximum value−minimum value) became larger by 1.2 nm than that before the thinning step.

EXAMPLE 6

This example provides an application of the present invention to ELTRAN (registered trademark).

One 300-mmϕ original SOI substrate as schematically shown in FIG. 2C was prepared using ELTRAN (registered trademark) (S10). The original SOI substrate was annealed in a hydrogen atmosphere under the same conditions as those in Example 3 (S20).

As for the SOI substrate after the annealing, the film thickness of the SOI layer was measured with a commercial optical interference type thicknessmeter. The film thickness was measured at 30 points on the X-axis with respect to the center of the SOI substrate serving as the origin. The mean film thickness was 60.5 nm.

The SOI layer of the SOI substrate was thinned using a commercial wet cleaning apparatus as a single-wafer processing apparatus 800 shown in FIG. 9 (S30).

In a unit thinning step of a thinning step, 12 ppm of ozone water were supplied for 60 sec while rotating the single-wafer processing apparatus 800 shown in FIG. 9 at 250 rpm (oxidation step in units of a predetermined thickness not more than that of one lattice). Pure water was supplied for 40 sec to completely remove the ozone water on the SOI substrate to be processed. A 0.7% hydrofluoric acid solution was supplied for 50 sec (silicon oxide layer removal step) to completely remove a silicon oxide film on the surface of the SOI substrate to be processed formed by the ozone water processing. Pure water was supplied for 40 sec to completely remove the hydrofluoric acid solution on the SOI substrate to be processed.

Such a cycle (unit thinning step) was continuously repeated 64 times (S30). As a result, the film thickness of the SOI layer became 32.7 nm. The range of the film thickness distribution of the entire SOI substrate (maximum value−minimum value) became smaller by 3 nm than that before the thinning step. Unlike Example 5, an increase in range due to the SOI layer thinning step, i.e., degradation in in-plane film thickness uniformity of the SOI substrate to be processed was not observed.

EXAMPLE 7

This example provides an application of the present invention to ELTRAN (registered trademark).

First, 225 original SOI substrates as schematically shown in FIG. 2C were prepared using ELTRAN (registered trademark) (S10).

The SOI layers of the 225 original SOI substrates were thinned in accordance with the procedure shown in FIG. 8 using a commercial single-wafer wet cleaning apparatus as a single-wafer processing apparatus 800 shown in FIG. 9 (S30). To measure the film thickness of each SOI layer, a commercial optical interference type thicknessmeter was used.

As the processing conditions in the thinning step, those in the description of the single-wafer processing apparatus 800 shown in FIG. 9 were adopted. A chemical solution to be used in the thinning step was prepared in accordance with a normal procedure using a mechanism included with the single-wafer wet cleaning apparatus. The temperature of the chemical solution was not controlled but kept almost at room temperature (23° C.).

FIG. 14 is a table showing results of measuring the thicknesses of the SOI layers before and after the thinning. In this example, the film thickness variation range between wafers reduced from 11.5 nm to 1.8 nm, and 225 SOI substrates with a high film thickness uniformity of 55±1 nm were obtained. The in-plane film thickness uniformity of each SOI substrate degraded by an average of less than 0.1 nm (with respect to the original SOI substrate). That is, the in-plane uniformity degraded extremely slightly.

As described above, it was confirmed that a commercial single-wafer wet cleaning apparatus could be used to obtain an SOI layer with high film-thickness uniformity without any special concentration/temperature control.

EXAMPLE 8

Figure 15:
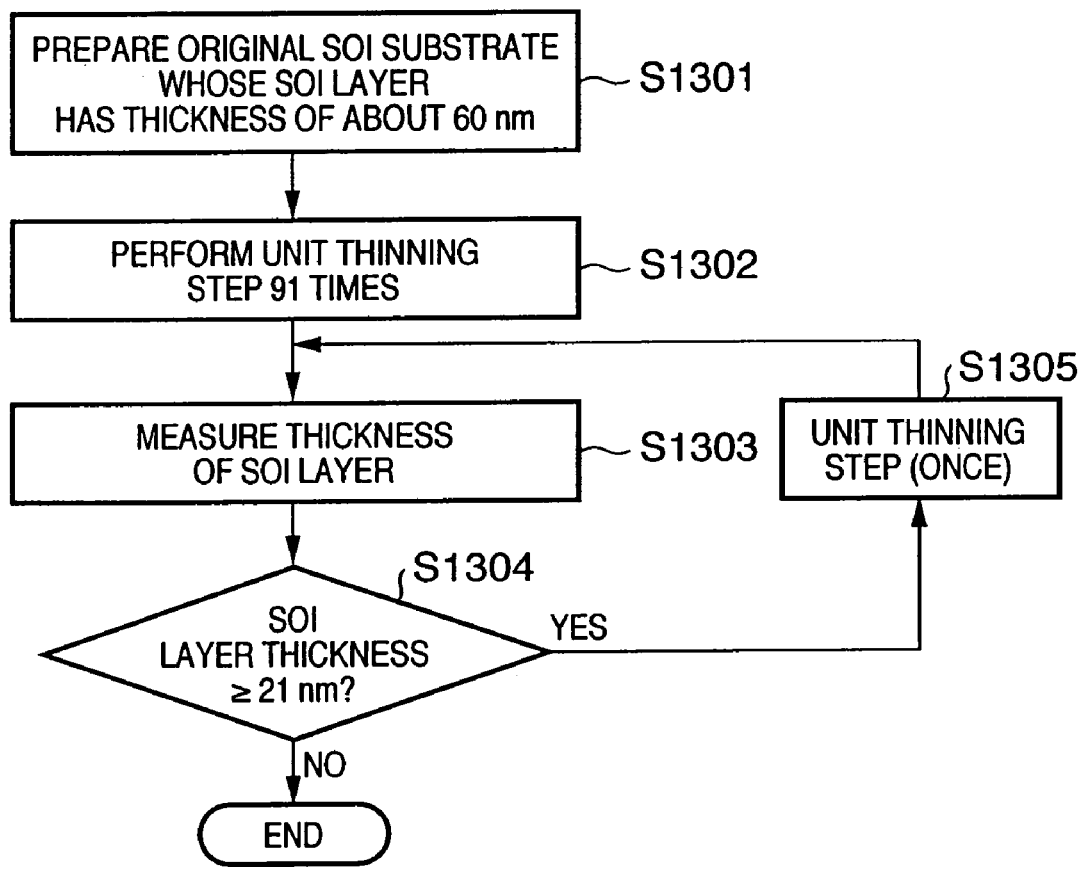
FIG. 15 is a flowchart showing an extra-thin SOI substrate manufacturing method.

This example provides an application of the present invention to ELTRAN (registered trademark). In this example, each SOI substrate was manufactured in accordance with the procedure shown in FIG. 15.

In step S1301 (corresponding to S10), original SOI substrates as schematically shown in FIG. 2C were prepared using ELTRAN (registered trademark). The size of each original SOI substrate was 8 inches, and the film thickness of an SOI layer was about 60 nm.

In step S1302, a unit thinning step was repeated 91 times for each of the original SOI substrates using a commercial single-wafer wet etching apparatus as a single-wafer processing apparatus 800 shown in FIG. 9. At this time, a cassette which accommodates a plurality of original SOI substrates was set in a processing apparatus 1000, and the SOI layers of the plurality of original SOI substrates were continuously thinned by automatic operation in accordance with a preset program. In this continuous processing, extraction and transport of each original SOI substrate from the cassette, thinning of the original SOI substrate, and storage of the SOI substrate after the thinning in the cassette were repeated for each of the plurality of SOI substrates. To move each SOI substrate, an automatic transport mechanism was used.

The ozone concentration of ozone water was 10 ppm, and the supply time for the ozone water at one time was 10 sec. As a hydrofluoric acid solution, a 0.7% dilute hydrofluoric acid was used, and the supply time for the hydrofluoric acid at one time was 8 sec. The rotational speed of each SOI substrate during the unit thinning step was 500 rpm. The temperatures of the SOI substrates and the chemical solution were not specially controlled and were kept at room temperature. After the unit thinning step was repeated 91 times, each SOI substrate was rinsed with pure water and dried while being rotated at a high speed (1,500 rpm).

In this manner, the unit thinning step was repeated 91 times for each of all the original SOI substrates accommodated in the cassette.

In step S1303, the cassette was moved to a film thickness measurement unit to measure the thickness of the SOI layer of each SOI substrate. An automatic ellipsometer having a wafer transport mechanism was used in this film thickness measurement. The plurality of cassettes were set in the ellipsometer. In accordance with the preset program, the transport mechanism extracts the SOI substrates one by one from the cassettes by automatic operation to perform the measurement. Each SOI substrate was measured at 17 in-plane points. The SOI substrate having undergone the measurement was returned to the cassette, and the next SOI substrate was extracted from the cassette for the measurement.

After the film thickness measurement for all the SOI substrates accommodated in the cassette ends, in step S1304, a computer processed the measurement results. The computer calculated ((maximum+minimum)/2) for each SOI substrate and defined the calculation result as a determination target film thickness. A determination reference value was set at 21 nm. In this example, a determination target film thickness equal to or more than the determination reference value was determined as NG while one less than the determination reference value was determined as OK.

Note that the number of in-plane measurement points of each SOI substrate, a method of determining the determination target film thickness, the determination reference value, and the like can appropriately be changed in accordance with the specification of an SOI substrate to be manufactured.

For example, the determination target film thickness may be a mean value of values obtained by measuring a film thickness at a plurality of in-plane points.

In this example, in step S1304, film thickness determination was performed for each of all the SOI substrates accommodated in the cassette. After that, the cassette was moved to the automatic single-wafer transfer apparatus. The automatic transfer apparatus extracted SOI substrates which have been determined as OK (to be referred to as OK wafers hereinafter) one by one from the cassette and accommodated them in another cassette (to be referred to as an OK cassette hereinafter).

After all the OK wafers were transferred to the "OK cassette", the original cassette having the remaining SOI substrates, which have been determined as NG, was moved to the single-wafer wet etching apparatus to perform final adjustment unit thinning step S1305. In final adjustment unit thinning step S1305, the unit thinning step is performed only once, and the flow advances to film thickness measurement step S1303. Accordingly, step S1305 is different from continuous unit thinning step S1302 of repeating the unit thinning step 91 times. As for the processing conditions, processing procedure, and the like, final adjustment unit thinning step S1305 was performed in the same manner as continuous unit thinning step S1302.

For each SOI substrate, the unit thinning step was repeated until the SOI substrate was determined as the OK wafer in determination step S1304, i.e., the thickness of the SOI layer was reduced to less than 21 nm.

In this manner, when all the SOI substrates were accommodated in the "OK cassette", the thinning step for the plurality of original SOI substrates ended.

The film thickness of each of 38 SOI substrates thinned in accordance with the above-mentioned procedure was measured at 49 in-plane points. For 1862 measurement points in total, the mean film thickness was 20.1 nm; the maximum value, 21.0 nm; the minimum value, 19.1 nm; and standard variation, 0.3 nm.

The surface roughness of each SOI layer having undergone the above-mentioned procedure was measured with an atomic force microscope. The resultant mean square roughnesses (Rms) were 0.11 nm (1 µm□), 0.11 nm (2 µm□), and 0.14 nm (10/µm□) (the value in each set of parentheses is a scan area of the atomic force microscope).

The defect densities of the entire SOI layers of three SOI substrates having undergone the above-mentioned procedure were evaluated by an HF defect evaluation method. The HF defect densities ranged from 0.23 to 0.30/cm.

As described above, according to the present invention, an extra-thin SOI substrate which is excellent in film thickness uniformity, surface roughness, and defect density can be formed.

The manufacturing process in this example can manufacture, by a minor change, an SOI layer with a precision of ±1 nm with respect to an arbitrary film thickness specification value as long as the film thickness falls within a range of 55 nm or less. More specifically, only by changing the repetition count in continuous unit thinning step S1302 and the determination reference value in film thickness determination step S1303, an SOI substrate which has an SOI layer with an arbitrary film thickness of 55 nm or less can be manufactured without changing the process conditions for the original SOI substrate manufacturing process.

Figure 16B:
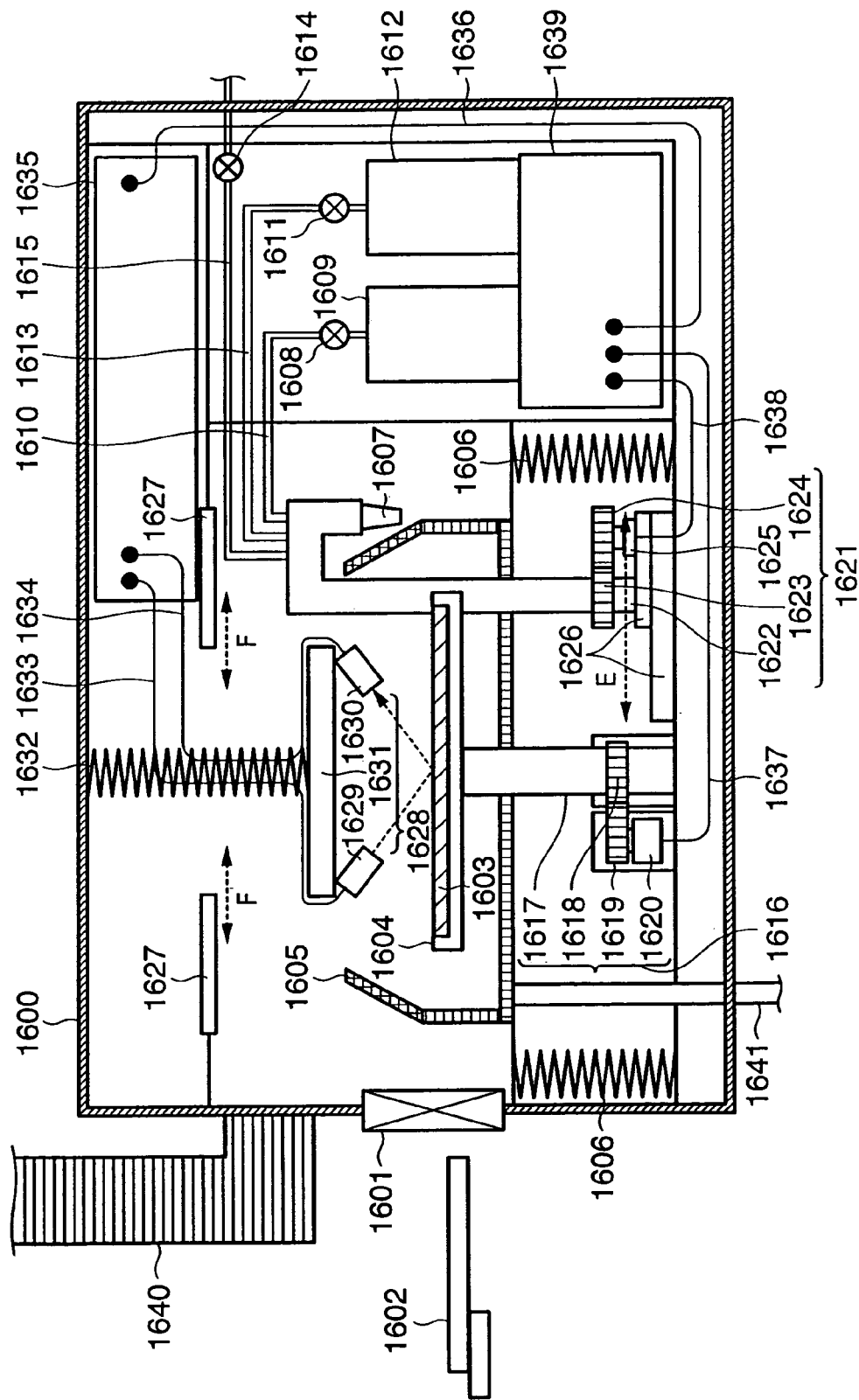
FIG. 16B is a sectional view of the schematic arrangement of the substrate processing apparatus according to another preferred embodiment of the present invention.

FIGS. 16A and 16B are sectional views showing the schematic arrangement of a substrate processing apparatus according to another preferred embodiment of the present invention.

A holding table 1604 is a holder for holding a semiconductor substrate 1603 to be processed. The substrate processing apparatus desirably employs a substrate which has a semiconductor layer (e.g., a semiconductor material such as silicon) on its surface as the semiconductor substrate 1603. More particularly, the substrate processing apparatus preferably employs an SOI (silicon on insulator or semiconductor on insulator) substrate in which a semiconductor layer is formed on an insulator. The holding table 1604 is desirably made of a material resistant to a chemical solution to be supplied to the semiconductor layer of the semiconductor substrate 1603. For example, when an etchant containing HF (to be referred to as a "hydrofluoric acid solution" hereinafter) is used as the chemical solution to be supplied to the semiconductor layer of the semiconductor substrate, the whole or a part which is in contact with the semiconductor substrate 1603 of the holding table 1604 is desirably made of an HF-resistant rubber or the like.

A substrate rotation mechanism 1616 is provided below the holding table 1604 to rotate the semiconductor substrate 1603. The substrate rotation mechanism 1616 may take various forms. For example, the substrate processing apparatus in FIG. 16A adopts a mechanism in which a substrate turning shaft 1617 is coupled to the lower portion of the holding table 1604, a substrate turning gear 1618 is attached to the substrate turning gear 1617, a substrate turning motor gear 1619 is meshed with the substrate turning gear 1618, and the substrate turning motor gear 1619 is rotated by a substrate turning motor 1620.

A chemical supply nozzle 1607 is provided above the holding table 1604 to supply a chemical solution to the semiconductor layer of the semiconductor substrate 1603. The chemical supply nozzle 1607 is driven by a nozzle driving mechanism 1621 in, e.g., the horizontal direction. The nozzle driving mechanism 1621 may take various forms. For example, a mechanism as shown in FIG. 16A can be considered. More specifically, a nozzle movable shaft 1622 coupled to the chemical supply nozzle 1607 is arranged on a nozzle movable rail 1626. A nozzle movable gear 1623 is attached to the nozzle movable shaft 1622 to mesh with a nozzle movable motor gear 1624. The nozzle movable shaft 1622 is rotated by a nozzle movable motor 1625. To load and transport the semiconductor substrate 1603, the chemical supply nozzle 1607 can be moved outside the holding table 1604, as shown in FIG. 16B, by rotating the chemical supply nozzle 1607 in a direction indicated by an arrow D in FIG. 16A about the nozzle movable shaft 1622 and sliding the nozzle movable shaft 1622 in a direction indicated by an arrow E in FIG. 16A (FIG. 16B).

The nozzle movable shaft 1622 is coupled to chemical solution supply lines for supplying chemical solutions to the semiconductor layer of the semiconductor substrate 1603. Each chemical solution supply line may take various forms. FIG. 16A illustrates an ozone water supply line 1610 which supplies ozone water, an etchant supply line 1613 which supplies an etchant such as a hydrofluoric acid solution, and a rinse supply line 1615 which supplies a rinse (e.g., pure water). These chemical supply lines are coupled to chemical solution supply units such as tanks which store chemical solutions. For example, the ozone water supply line 1610 is coupled to an ozone water supply unit 1609 which stores ozone water; the etchant supply line 1613, an etchant supply unit 1612 which stores a hydrofluoric acid solution; and the rinse supply line 1615, a rinse supply unit (not shown) which stores a rinse. An ozone water supply valve 1608, etchant supply valve 1611, and rinse supply valve 1614 are provided in the ozone water supply line 1610, etchant supply line 1613, and rinse supply line 1615, respectively. These valves 1608, 1611, and 1614 are automatically opened or closed by a controller 1639 and can start or end a process of chemically etching the semiconductor layer of the semiconductor substrate 1603.

To perform etching according to the present invention, various cleaning solutions can be adopted depending on the material for the semiconductor layer to be etched on the surface of the semiconductor substrate. In this embodiment, the semiconductor layer (silicon) on the surface of the semiconductor substrate is oxidized with ozone water, and the silicon oxide is etched using a hydrofluoric acid solution (including a solution mixture of HF and at least one of $H_2O$, $HNO_3$, and $CH_3COOH$). The present invention, however, is not limited to this, and various acidic or alkaline chemical solutions can be adopted. For example, etching may be performed using a cleaning solution (APM) obtained by mixing $NH_4OH$, $H_2O_2$, and $H_2O$. In this case, APM slightly etches the oxidized silicon surface while forming an oxide film on the silicon surface. For this reason, oxidation with ozone water need not be performed. Etching using an organic alkaline developing solution such as TMAH (tetramethylammonium hydroxide) can also be adopted. Thus, as the above-mentioned chemical supply lines and chemical supply units, ones corresponding to chemical solutions can be adopted.

When a chemical solution is supplied to the semiconductor layer of the semiconductor substrate 1603, and the semiconductor substrate 1603 is rotated by the substrate rotation mechanism 1616, the chemical solution on the semiconductor layer of the semiconductor substrate 1603 may splash to attach to mechanisms around the substrate rotation mechanism 1616. The mechanisms around the substrate rotation mechanism 1616 can be corroded by splashes of the chemical solution. For this reason, desirably, each mechanism around the substrate rotation mechanism 1616 is made of a material resistant to the chemical solution, or a chemical anti-splash cup 1605 serving as a cover member is arranged, as shown in FIG. 16A, so as to surround a region in which the semiconductor substrate 1603 is arranged. The chemical anti-splash cup 1605 desirably comprises a cup elevating mechanism 1606 which vertically drives the chemical anti-splash cup 1605 with respect to the surface of the semiconductor substrate 1603. The cup elevating mechanism 1606 can move down the chemical anti-splash cup 1605 to load or transport the semiconductor substrate 1603 while it can move up the chemical anti-splash cup 1605 to supply a chemical solution to the semiconductor layer of the semiconductor substrate 1603. Also, the chemical anti-splash cup 1605 can comprise a discharge line which discharges the chemical solution supplied to the semiconductor layer of the semiconductor substrate 1603.

A film thickness measurement unit 1628 is provided at the upper portion of the substrate processing apparatus to measure the film thickness of the semiconductor layer of the semiconductor substrate 1603. The film thickness measurement unit 1628 may take various forms. Typically, the film thickness measurement unit 1628 comprises a source 1629 which irradiates the surface of the semiconductor layer of the semiconductor substrate 1603 with light, X-rays, or ultrasonic waves, a detector 1630 which measures light, X-rays, or ultrasonic waves reflected on the surface of the semiconductor layer of the semiconductor substrate 1603, a source/detector mount 1631 which fixes the source 1629 and detector 1630, and a film thickness change unit 1635 which converts a measurement result from the detector 1630 into the film thickness of the semiconductor layer of the semiconductor substrate 1603, as shown in FIG. 16A. The source 1629 is connected to the film thickness change unit 1635 through a connection cable such as an irradiation light optical fiber 1633. Similarly, the detector 1630 is connected to the film thickness change unit 1635 through a connection cable such as a reflected light optical fiber 1634. The film thickness measurement unit 1628 preferably comprises a film thickness measurement unit elevating mechanism 1632 which drives the film thickness measurement unit 1628 in a direction perpendicular to the surface of the semiconductor substrate 1603. To measure the surface of the semiconductor layer of the semiconductor substrate 1603, the film thickness measurement unit elevating mechanism 1632 moves down the source/detector mount 1631 (FIG. 16B) after a film thickness measurement unit storage door 1627 opens. The film thickness measurement unit 1628 having measured the surface of the semiconductor layer of the semiconductor substrate 1603 is accommodated in the film thickness measurement unit storage door 1627.

The film thickness change unit 1635 is connected to the controller 1639 through a connection cable 1636 which connects the film thickness change unit 1635 and controller 1639. The controller 1639 can determine whether to perform etching on the basis of data converted by the film thickness change unit 1635. The controller 1639 is connected to a substrate turning motor 1620 through a connection cable 1637 which connects the substrate turning motor 1620 and controller 1639. The controller 1639 is also connected to the nozzle movable motor 1625 and nozzle movable rail 1626 through a connection cable 1638 which connects the nozzle movable motor 1625 and nozzle movable rail 1626 to the controller 1639. These connections are merely examples, and controller 1639 may be connected to other units.

A (semiconductor) substrate transport robot 1602 comprises a robot hand which is configured to chuck and hold the lower surface of the semiconductor substrate 1603 and can transport the semiconductor substrate 1603 through a (semiconductor) substrate transport port 1601. This robot hand can prevent the surface of the semiconductor substrate 1603 from being contaminated or damaged. A substrate processing apparatus 1600 is coupled to an exhaust duct 1640 and is configured to externally exhaust the atmosphere in the substrate processing apparatus 1600.

Operation of the substrate processing apparatus according to this embodiment shown in FIGS. 16A and 16B will be described.

The semiconductor substrate transport port 1601 opens, and the semiconductor substrate transport robot 1602 transports the semiconductor substrate 1603 into the substrate processing apparatus 1600 and sets it on the holding table 1604. At this time, the chemical anti-splash cup 1605 has been moved down by the cup elevating mechanism 1606 to a position which does not hinder transport of the semiconductor substrate 1603. When the semiconductor substrate 1603 is set on the holding table 1604, the cup elevating mechanism 1606 moves up the chemical anti-splash cup 1605 and stops at a predetermined position (FIG. 16A).

The semiconductor substrate 1603 receives a power (due to rotation in a direction indicated by an arrow A) from the substrate rotation mechanism 1616 to rotate in a direction indicated by an arrow B. At this time, the chemical supply nozzle 1607 can receive a power (an arrow C in FIG. 16A) from the nozzle driving mechanism 1621 to scan the semiconductor layer of the semiconductor substrate 1603 in a direction of the arrow D.

Ozone water is supplied from the chemical supply nozzle 1607 while scanning the semiconductor layer of the semiconductor substrate 1603. The supply is stopped after a predetermined period of time has elapsed. The ozone water supply valve 1608 is opened, and the ozone water flows from the ozone water supply unit 1609 through the ozone water supply line 1610. The ozone water is supplied from the chemical supply nozzle 1607 to the semiconductor layer of the semiconductor substrate 1603. Supplying the ozone water to the semiconductor layer of the semiconductor substrate 1603 oxidizes the surface of the semiconductor layer.

A hydrofluoric acid solution is supplied from the chemical supply nozzle 1607 while scanning the semiconductor layer of the semiconductor substrate 1603. The supply is stopped when a predetermined period of time has elapsed. Similarly to the ozone water, the etchant supply valve 1611 is opened, and the hydrofluoric acid solution flows from the etchant supply unit 1612 through the etchant supply line 1613. The hydrofluoric acid solution is supplied from the chemical supply nozzle 1607 to the semiconductor layer of the semiconductor substrate 1603. Supplying the hydrofluoric acid solution to the semiconductor layer of the semiconductor substrate 1603 etches the surface of the semiconductor layer.

A rinse is supplied from the chemical supply nozzle 1607 while scanning the semiconductor layer of the semiconductor substrate 1603. The supply is stopped when a predetermined period of time has elapsed. The rinse supply valve 1614 is opened, and the rinse flows from the rinse supply unit (not shown) through the rinse supply line 1615. The rinse is supplied from the chemical supply nozzle 1607 to the semiconductor layer of the semiconductor substrate 1603.

The semiconductor substrate 1603 is rotated at a high speed by the substrate rotation mechanism 1616 and is spin-dried. Note that the chemical solutions such as the ozone water, etchant, and rinse after the chemical solution processing are discharged from a discharge line 1641 provided for the chemical anti-splash cup 1605.

The chemical supply nozzle 1607 is moved to a position which does not hinder film thickness measurement by operation of the nozzle driving mechanism 1621 (arrow C) and operation of the nozzle movable rail 1626 (arrow. E) (FIG. 16B). The film thickness measurement unit storage door 1627 opens in a direction indicated by an arrow F, and the film thickness measurement unit elevating mechanism 1632 extends. The film thickness measurement unit 1628 moves down to a predetermined position and stops. The film thickness measurement unit 1628 comprises the source 1629, the detector 1630, and the source/detector mount 1631 which fixes them. They are connected to the film thickness change unit 1635 through the irradiation light optical fiber 1633 and reflected light optical fiber 1634.

The film thickness measurement starts. The principle of the film thickness measurement is as follows. More specifically, light is emitted from the film thickness change unit 1635 including a light source and passes through the irradiation light optical fiber 1633. The light emerges from the source 1629 and is reflected on the semiconductor layer of the semiconductor substrate 1603. The light is received by the detector 1630 as reflected light containing an interference signal. The light received by the detector 1630 is returned to the film thickness change unit 1635 through the reflected light optical fiber 1634. The film thickness change unit 1635 converts data of this reflected light into a film thickness.

The film thickness measurement data, which has been converted into the film thickness by the film thickness change unit 1635, is transmitted to the controller 1639, and it is determined whether the next etching should be performed. The film thickness measurement unit 1628 is accommodated inside the film thickness measurement unit storage door 1627 immediately after the film thickness measurement. The chemical supply nozzle 1607, which has been moved to a position that does not hinder the film thickness measurement, is returned to the original position (FIG. 16A).

If the controller 1639 determines on the basis of the film thickness measurement data, which has been converted into the film thickness by the film thickness change unit 1635, that the film thickness reaches a predetermined value and determines to "stop the etching", the cup elevating mechanism 1606 moves down the chemical anti-splash cup 1605 to a position which does not hinder transport of the semiconductor substrate 1603. The semiconductor substrate transport port 1601 opens, and the semiconductor substrate transport robot 1602 unloads the semiconductor substrate 1603 from the substrate processing apparatus 1600. The etching ends.

On the other hand, if the controller 1639 determines on the basis of the film thickness measurement data, which has been converted into the film thickness by the film thickness change unit 1635, to "continue the etching", the above-mentioned process of supplying ozone water while scanning the semiconductor layer of the semiconductor substrate 1603 starts. Then, the etching and film thickness measurement are automatically repeated until the controller 1639 determines on the basis of the film thickness measurement data, which has been converted into the film thickness by the film thickness change unit 1635, that the film thickness reaches the predetermined value and determines to "stop the etching". After that, i.e., if the controller 1639 determines to "stop the etching", the chemical anti-splash cup 1605 moves down to the position which does not hinder the transport of the semiconductor substrate 1603. The semiconductor substrate transport port 1601 opens, and the semiconductor substrate transport robot 1602 unloads the semiconductor substrate 1603 from the substrate processing apparatus 1600. The etching ends.

As described above, according to this embodiment, the semiconductor layer of a semiconductor substrate can be etched and thinned precisely and efficiently. To thin the semiconductor layer of the semiconductor substrate, chemical mechanical polishing (CMP) is also available. Since CMP shaves off the surface of the semiconductor layer by mechanical polishing, a stress is applied to the semiconductor layer of the semiconductor substrate, and it is difficult to precisely thin the semiconductor layer. On the other hand, according to this embodiment, instead of mechanical polishing, a chemical is supplied to chemically etch the semiconductor layer of the semiconductor substrate. Accordingly, no stress is applied to the semiconductor layer of the semiconductor substrate, and the semiconductor layer can precisely be thinned.

Also, according to this embodiment, in etching using a cleaning solution for wet cleaning, the film thickness of a substrate to be processed can automatically be measured while being held on a holding table (in-line). For this reason, the risk of overetching can greatly be reduced, and the efficiency of wet etching can be increased.

Figure 17A:
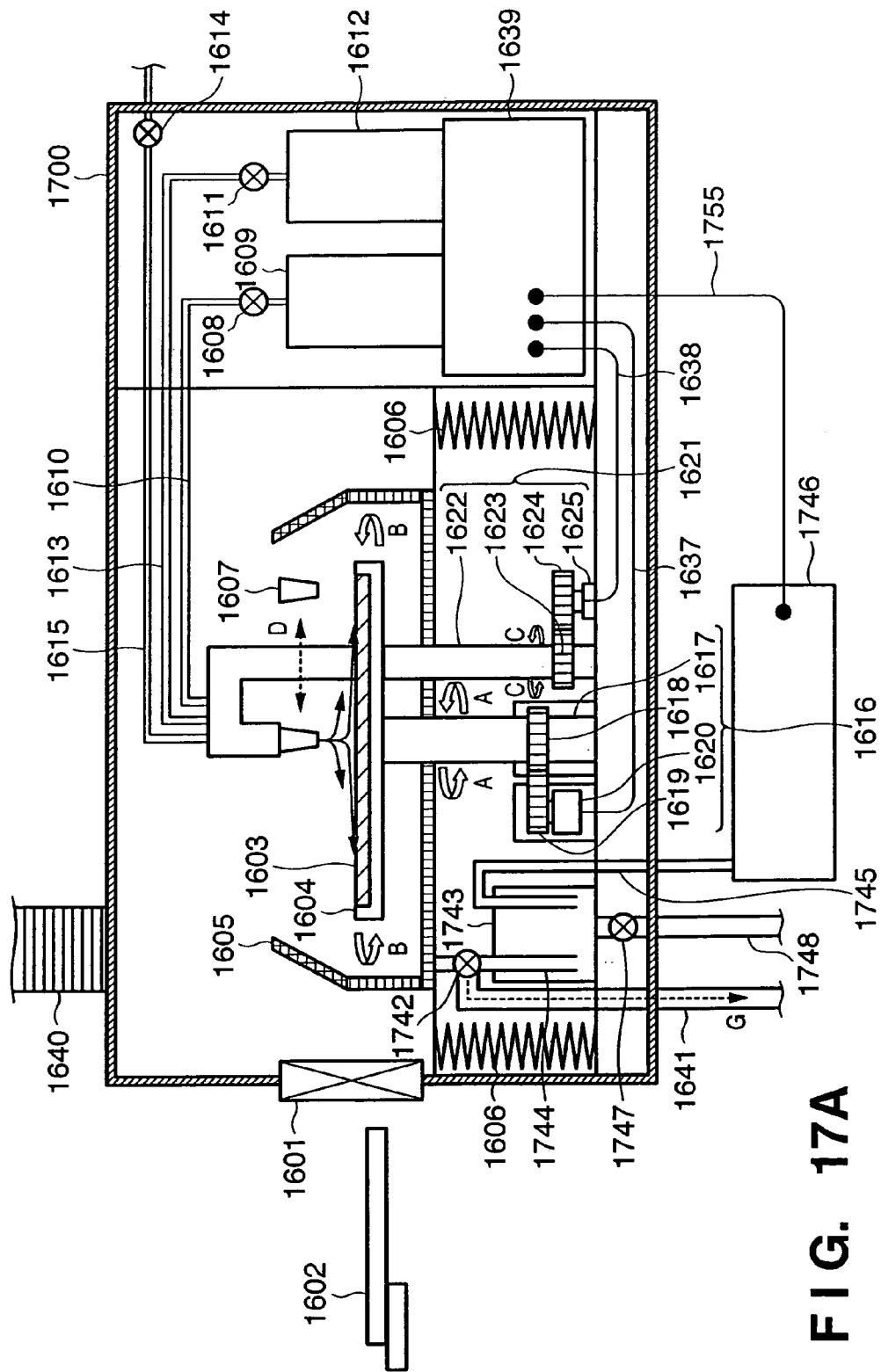
FIG. 17A is a sectional view of the schematic arrangement of a substrate processing apparatus according to still another preferred embodiment of the present invention.
Figure 17B:
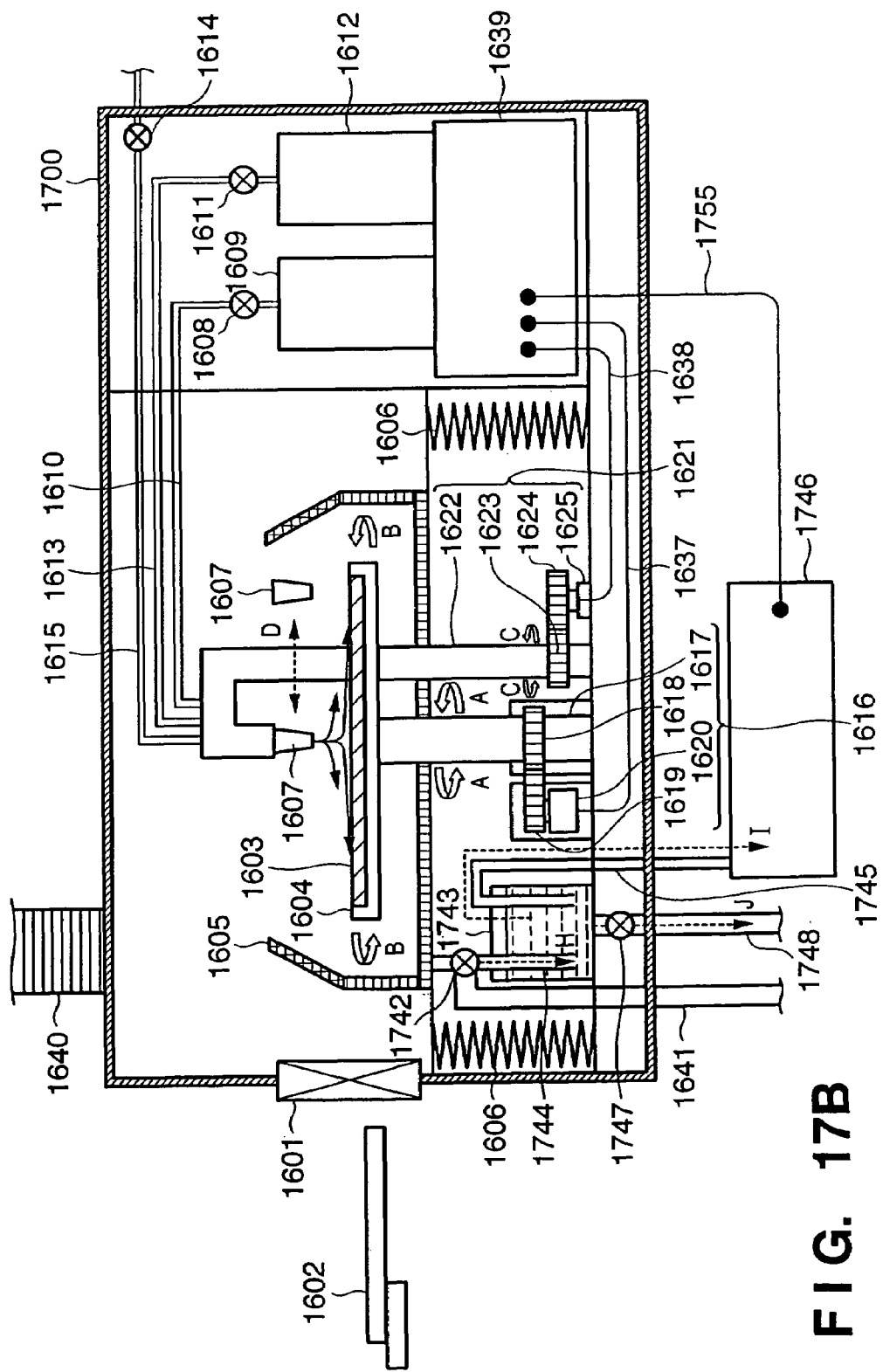
FIG. 17B is a sectional view of the schematic arrangement of the substrate processing apparatus according to still another preferred embodiment of the present invention.

A substrate processing apparatus according to still another embodiment of the present invention will be described below. As shown in FIGS. 17A and 17B, in broad outline, a substrate processing apparatus 1700 according to this embodiment is obtained by changing part of the arrangement of the substrate processing apparatus 1600 according to the above-mentioned embodiment. More specifically, the substrate processing apparatus 1700 comprises a chemical discharge/recovery valve 1742, HF recovery container 1743, HF recovery line 1744, chemical sampling tube 1745, Si concentration analyzer 1746, HF discharge valve 1747, and HF discharge line 1748 shown in FIGS. 17A and 17B, instead of the film thickness measurement unit 1628 shown in FIGS. 16A and 16B. The Si concentration analyzer 1746 is connected to a controller 1639 through a connection cable 1755.

The chemical discharge/recovery valve 1742 is arranged between a discharge line 1641 and the HF recovery line 1744 of a chemical anti-splash cup 1605. When the chemical discharge/recovery valve 1742 is opened, a chemical solution is discharged through the discharge line 1641, as indicated by an arrow G in FIG. 17A. On the other hand, when the chemical discharge/recovery valve 1742 is closed, the chemical solution is recovered to the HF recovery container 1743 through the HF recovery line 1744, as indicated by an arrow H in FIG. 17B. The Si concentration analyzer 1746 is coupled to the chemical sampling tube 1745 and can measure the concentration of Si contained in the chemical solution recovered to the HF recovery container 1743. The HF recovery container 1743 is coupled to the HF discharge line 1748. When the HF discharge valve 1747 is opened, the chemical solution is discharged through the HF discharge line 1748.

Operation of the substrate processing apparatus according to this embodiment shown in FIGS. 17A and 17B will be described.

A semiconductor substrate transport port 1601 opens, and a semiconductor substrate transport robot 1602 transports a semiconductor substrate 1603 into the substrate processing apparatus 1700 and sets it on a holding table 1604. At this time, the chemical anti-splash cup 1605 has been moved down by a cup elevating mechanism 1606 to a position which does not hinder transport of the semiconductor substrate 1603. When the semiconductor substrate 1603 is set on the holding table 1604, the cup elevating mechanism 1606 moves up the chemical anti-splash cup 1605 and stops at a predetermined position (FIG. 17A).

The semiconductor substrate 1603 receives a power (due to rotation in a direction indicated by an arrow A in FIG. 17A) from a substrate rotation mechanism 1616 to rotate in a direction indicated by an arrow B in FIG. 17A. At this time, a chemical supply nozzle 1607 can receive a power (an arrow C in FIG. 17A) from a nozzle driving mechanism 1621 to scan the semiconductor layer of the semiconductor substrate 1603 in a direction of an arrow D.

An ozone water supply valve 1608 is opened, and ozone water flows from an ozone water supply unit 1609 through an ozone water supply line 1610. The ozone water is supplied from the chemical supply nozzle 1607 to the semiconductor layer of the semiconductor substrate 1603. The supply of the ozone water from the chemical supply nozzle 1607 is performed while scanning the semiconductor layer of the semiconductor substrate 1603. The supply is stopped when a predetermined period of time has elapsed. The ozone water is discharged by opening the chemical discharge/recovery valve 1742, as indicated by the arrow G. After discharging the ozone water, the chemical discharge/recovery valve 1742 is closed so as to recover a dilute hydrofluoric acid processing solution. The dilute hydrofluoric acid processing solution is recovered to the HF recovery container 1743 through the HF recovery line 1744 by closing the chemical discharge/recovery valve 1742 (the arrow H in FIG. 17B). After recovering the dilute hydrofluoric acid processing solution, the chemical discharge/recovery valve 1742 is reopened so as to prepare for the next rinse processing. Part of the semiconductor substrate (Si) 1603, which has been removed by the etching using the hydrofluoric acid solution, is contained in the HF processing solution recovered to the HF recovery container 1743.

The recovered dilute hydrofluoric acid processing solution is introduced to the Si concentration analyzer 1746 through the chemical sampling tube 1745 to measure the Si concentration (an arrow I in FIG. 17B). Analysis data of the Si concentration is transmitted to the controller 1639, which automatically calculates the etching amount, the thickness of a residual film thickness, and the like from the analysis data. The controller 1639 determines whether to go on to the next etching. When the Si concentration analysis ends, the HF discharge valve 1747 is opened to discharge the dilute hydrofluoric acid processing solution recovered from the HF discharge line 1748 (an arrow J in FIG. 17B). The substrate processing apparatus 1700 performs rinse processing and drying subsequent to the dilute hydrofluoric acid processing in parallel to the Si concentration analysis.

More specifically, subsequently to the dilute hydrofluoric acid processing, a rinse is supplied from the chemical supply nozzle 1607 while scanning the semiconductor layer of the semiconductor substrate 1603. The supply is stopped when a predetermined period of time has elapsed. The semiconductor substrate 1603 is rotated at a high speed by the substrate rotation mechanism 1616 and is spin-dried.

Then, a rinse supply valve 1614 opens, and the rinse flows from a rinse supply unit (not shown) through a rinse supply line 1615. The rinse is supplied from the chemical supply nozzle 1607 to the semiconductor layer of the semiconductor substrate 1603. The rinse is discharged from the open chemical discharge/recovery valve 1742 as indicated by the arrow G in FIG. 17A.

Similarly to the above-mentioned processing, the controller 1639 determines whether to go on to the subsequent etching during the rinse processing and drying. If the controller 1639 determines by automatic calculation on the basis of the analysis data of the Si concentration that the film thickness reaches a predetermined value and determines to "stop the etching", the chemical anti-splash cup 1605 moves down to a position which does not hinder transport of the semiconductor substrate 1603. The semiconductor substrate transport port 1601 opens, and the semiconductor substrate transport robot 1602 unloads the semiconductor substrate 1603 from the substrate processing apparatus 1700. The etching ends.

On the other hand, if the controller 1639 determines by the automatic calculation on the basis of the analysis data of the Si concentration to "go on to the etching", a process of supplying the ozone water while performing scanning starts. Then, the etching and Si concentration analysis are automatically repeated until the controller 1639 determines by the automatic calculation on the basis of the analysis data of the Si concentration that the film thickness reaches the predetermined value and determines to "stop the etching". After that, i.e., if the controller 1639 determines to "stop the etching", the chemical anti-splash cup 1605 moves down to the position which does not hinder the transport of the semiconductor substrate 1603. The semiconductor substrate transport port 1601 opens, and the semiconductor substrate transport robot 1602 unloads the semiconductor substrate 1603 from the substrate processing apparatus 1700. The etching ends.

As described above, according to this embodiment, the film thickness can be measured in real time, and thus the end position of the wet etching can be controlled at higher precision.

Figure 18:
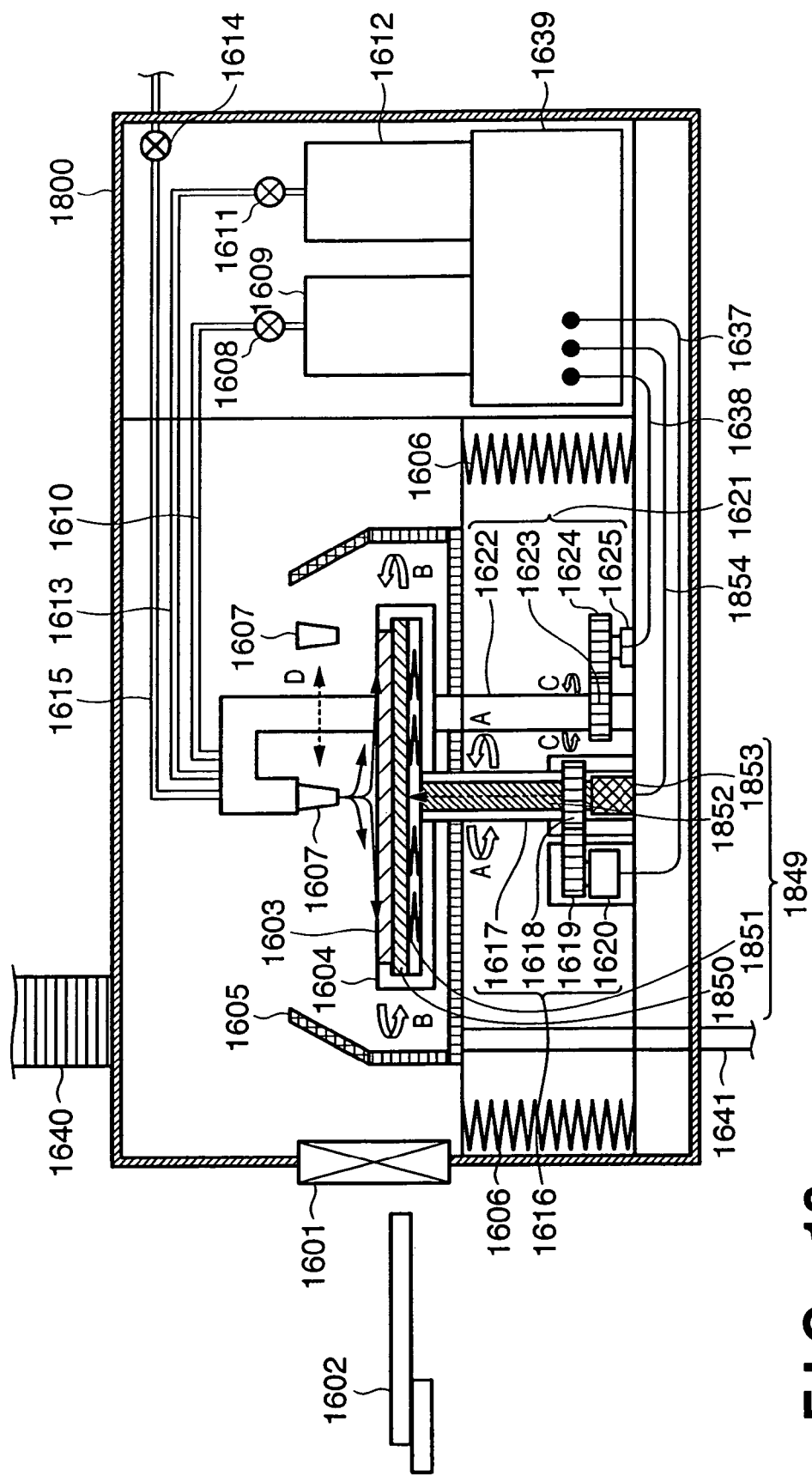
FIG. 18 is a sectional view of the schematic arrangement of a substrate processing apparatus according to still another preferred embodiment of the present invention.

A substrate processing apparatus according to still another embodiment of the present invention will be described below. As shown in FIG. 18, in broad outline, a substrate processing apparatus 1800 according to this embodiment is obtained by changing part of the arrangement of the substrate processing apparatus 1600 according to the above-mentioned embodiment. More specifically, the substrate processing apparatus 1800 comprises an electronic precision weight measurement mechanism 1849 shown in FIG. 18, instead of the film thickness measurement unit 1628 shown in FIGS. 16A and 16B.

The electronic precision weight measurement mechanism 1849 may take various forms. Typically, the electronic precision weight measurement mechanism 1849 can comprise a semiconductor substrate weighing platform 1850, semiconductor substrate weighing platform support spring 1851, semiconductor substrate weight transmission shaft 1852, and electronic precise weight measurement unit 1853.

The semiconductor substrate weighing platform 1850 is elastically arranged on a holding table 1604 through the semiconductor substrate weighing platform support spring 1851. The semiconductor substrate weight transmission shaft 1852 has a sharp projection at its tip and comes into contact with the concave portion of the lower surface of the semiconductor substrate weighing platform 1850. The electronic precise weight measurement unit 1853 can precisely measure the weight of a semiconductor substrate 1603 through the semiconductor substrate weight transmission shaft 1852. The electronic precise weight measurement unit 1853 is connected to a controller 1639 through a connection cable 1854.

Operation of the substrate processing apparatus according to this embodiment shown in FIG. 18 will be described.

A semiconductor substrate transport port 1601 opens, and a semiconductor substrate transport robot 1602 transports the semiconductor substrate 1603 into the substrate processing apparatus 1800 and sets it on the holding table 1604. At this time, a chemical anti-splash cup 1605 has been moved down by a cup elevating mechanism 1606 to a position which does not hinder transport of the semiconductor substrate 1603. When the semiconductor substrate 1603 is set on the holding table 1604, the cup elevating mechanism 1606 moves up the chemical anti-splash cup 1605 and stops at a predetermined position (FIG. 18).

The semiconductor substrate 1603 receives a power (due to rotation in a direction indicated by an arrow A in FIG. 18) from a substrate rotation mechanism 1616 to rotate in a direction indicated by an arrow B in FIG. 18. At this time, a chemical supply nozzle 1607 can receive a power (an arrow C in FIG. 18) from a nozzle driving mechanism 1621 to scan the semiconductor layer of the semiconductor substrate 1603 in a direction of an arrow D.

Ozone water is supplied from the chemical supply nozzle 1607 while scanning the semiconductor layer of the semiconductor substrate 1603. The supply is stopped when a predetermined period of time has elapsed. An ozone water supply valve 1608 is opened, and ozone water flows from an ozone water supply unit 1609 through an ozone water supply line 1610. The ozone water is supplied from the chemical supply nozzle 1607 to the semiconductor layer of the semiconductor substrate 1603. A hydrofluoric acid solution is supplied from the chemical supply nozzle 1607 while scanning the semiconductor layer of the semiconductor substrate 1603. The supply is stopped when a predetermined period of time has elapsed. Similarly to the ozone water, an etchant supply valve 1611 is opened, and the hydrofluoric acid solution flows from an etchant supply unit 1612 through an etchant supply line 1613. The hydrofluoric acid solution is supplied from the chemical supply nozzle 1607 to the semiconductor layer of the semiconductor substrate 1603. Supplying the hydrofluoric acid solution to the semiconductor layer of the semiconductor substrate 1603 chemically etches the semiconductor substrate having been oxidized with the ozone water.

A rinse is supplied from the chemical supply nozzle 1607 while scanning the semiconductor layer of the semiconductor substrate 1603. The supply is stopped when a predetermined period of time has elapsed. A rinse supply valve 1614 is opened, and the rinse flows from a rinse supply unit (not shown) through a rinse supply line 1615. The rinse is supplied from the chemical supply nozzle 1607 to the semiconductor layer of the semiconductor substrate 1603.

The semiconductor substrate 1603 is rotated at a high speed by the substrate rotation mechanism 1616 and is spin-dried. Note that the ozone water, etchant, and rinse after the chemical solution processing are discharged from a discharge line 1641 provided for the chemical anti-splash cup 1605.

The electronic precision weight measurement mechanism 1849 is incorporated capable of precisely measuring the weight of the semiconductor substrate 1603 in the holding table 1604 and a substrate turning shaft 1617. The weight of the semiconductor substrate 1603 can continuously be measured during the above-mentioned ozone water processing, etching, and rinse processing in sequence. The measurement data of the weight of the semiconductor substrate 1603 obtained by the electronic precise weight measurement unit 1853 is transmitted to the controller 1639. The controller 1639 automatically calculates the etching amount, residual film thickness, and the like from the measurement data and determines whether to go on to the next etching.

If the controller 1639 determines on the basis of the measurement data obtained by the electronic precise weight measurement unit 1853 that the film thickness reaches a predetermined value and determines to "stop the etching", the cup elevating mechanism 1606 moves down the chemical anti-splash cup 1605 to a position which does not hinder transport of the semiconductor substrate 1603. The semiconductor substrate transport port 1601 opens, and the semiconductor substrate transport robot 1602 unloads the semiconductor substrate 1603 from the substrate processing apparatus 1800. The etching ends.

On the other hand, if the controller 1639 determines on the basis of the measurement data obtained by the electronic precise weight measurement unit 1853 to "go on to the etching", the above-mentioned process of supplying the ozone water from the chemical supply nozzle 1607 while scanning the semiconductor layer of the semiconductor substrate 1603 starts. Then, the etching and film thickness measurement are automatically repeated until the controller 1639 determines on the basis of the measurement data obtained by the electronic precise weight measurement unit 1853 that the film thickness reaches the predetermined value and determines to "stop the etching". After that, i.e., if the controller 1639 determines that the film thickness reaches the predetermined value and determines to "stop the etching", the chemical anti-splash cup 1605 moves down to the position which does not hinder the transport of the semiconductor substrate 1603. The semiconductor substrate transport port 1601 opens, and the semiconductor substrate transport robot 1602 unloads the semiconductor substrate 1603 from the substrate processing apparatus 1800. The etching ends.

As described above, according to this embodiment, the film thickness can be measured in real time, and thus the end position of the wet etching can be controlled at higher precision.

As an application of a substrate processing apparatus according to a preferred embodiment of the present invention to a substrate manufacturing method, one using ELTRAN (registered trademark) will be illustrated. FIGS. 19A to 19F are schematic views for explaining an SOI substrate manufacturing method according to this embodiment.

Figure 19A:
FIGS. 19A to 19F are views for explaining a substrate manufacturing method according to still another preferred embodiment of the present invention.
Figure 19B:
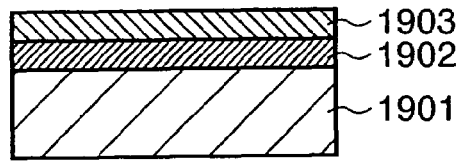
Figure 19C:
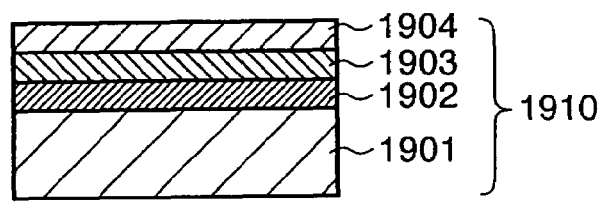
Figure 19D:
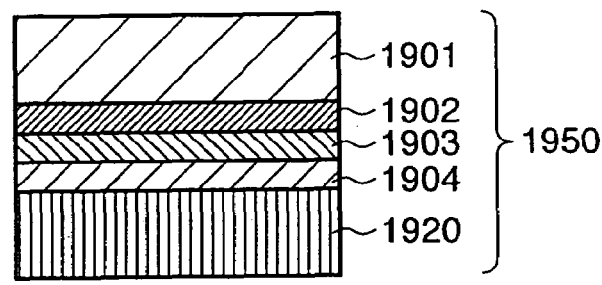
Figure 19E:
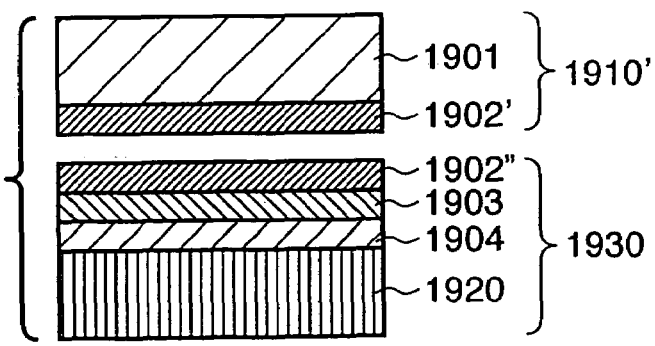
Figure 19F:
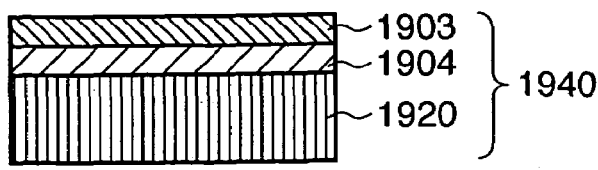

First, in the step shown in FIG. 19A, a single-crystal Si substrate 1901 is prepared, and a porous Si layer 1902 is formed on the surface of the single-crystal Si substrate 1901 by, e.g., anodization. Then, in the step shown in FIG. 19B, a porous single-crystal Si layer 1903 is formed on the porous Si layer 1902 by epitaxial growth. In the step shown in FIG. 19C, the surface of the porous single-crystal Si layer 1903 is oxidized to form an insulating layer ($SiO_2$ layer) 1904 on its surface. With this process, a first substrate 1910 is formed. In the step shown in FIG. 19D, a second substrate 1920 made of single-crystal Si is prepared. The first substrate 1910 and second substrate 1920 are bonded together at room temperature such that the second substrate 1920 and SOI substrate 1940 face each other, thereby forming a bonded substrate stack 1950. In the step shown in FIG. 19E, the bonded substrate 1950 is separated at the porous Si layer 1902 into a new first substrate 1910' and new second substrate 1930. After that, in the step shown in FIG. 19F, a porous layer 1902" and porous single-crystal Si layer 1903 are etched at a high selection ratio. The porous layer 1902″ is removed almost without reducing the film thickness of the porous single-crystal Si layer 1903 to form an SOI substrate 1940. With the above-mentioned operation, the porous single-crystal Si layer 1903 and insulating layer 1904 serving as transfer layers are transferred onto the second substrate 1930. An SOI substrate having an extremely flat surface can be formed by annealing the SOI substrate 1940 in a hydrogen atmosphere. At this time, the insulating layer 1904 (part of a silicon oxide film) serving as a BOX layer is formed in the second substrate (handle substrate) 1920. In the step shown in FIG. 19F, each of the substrate processing apparatuses 1600, 1700, and 1800 according to the preferred embodiments of the present invention can perform wet etching efficiently and precisely such that the porous single-crystal Si layer 1903 has a predetermined thickness. Although this embodiment has explained ELTRAN (registered trademark), any other substrate manufacturing method can be applied.

As has been described above, according to the preferred embodiments of the present invention shown in FIGS. 16A to 19, e.g., etching can be controlled precisely and efficiently.

As many apparently widely different embodiments of the present invention can be made without departing from the spirit and scope thereof, it is to be understood that the invention is not limited to the specific embodiments thereof except as defined in the appended claims.

What is claimed is:

1. A substrate manufacturing method comprising:
    a preparation step of preparing a substrate which has a silicon layer on an insulating layer; and
    a thinning step of thinning the silicon layer on the insulting layer to a desired thickness,
    wherein in the thinning step, a unit thinning step including an oxidation step of oxidizing a surface of the silicon layer by a predetermined thickness, and a removal step of selectively removing silicon oxide formed in the oxidation step is performed not less than twice, and
    wherein in the oxidation step, the silicon layer is oxidized in an atmosphere with an oxygen content adjusted so as to oxidize the surface of the silicon layer only by the predetermined thickness not more than a thickness of one lattice.

2. The method according to claim 1, wherein in the oxidation step, any one of a gas containing ozone, water containing ozone, a hydrogen peroxide solution, and nitric acid is supplied to the surface of the silicon layer.

3. The method according to claim 1, wherein in the oxidation step, the silicon layer is exposed to an atmosphere containing one of oxygen and ozone, and the surface of the silicon layer is irradiated with ultraviolet rays.

4. The method according to claim 1, wherein in the removal step, the silicon oxide formed in the oxidation step is removed using a hydrofluoric acid solution.

5. The method according to claim 1, wherein in the removal step, the silicon oxide formed in the oxidation step is completely removed.

6. The method according to claim 1, wherein an oxidizing agent used in the oxidation step is completely removed from the silicon oxide, prior to the removal step.

7. The method according to claim 1, further comprising as steps to be performed after the unit thinning step is repeated a predetermined number of times:
    a measurement step of measuring a thickness of the silicon layer; and
    a determination step of determining on the basis of a measurement result in the measurement step whether the silicon layer has the desired thickness,
    wherein the unit thinning step is repeated until it is determined in the determination step that the silicon layer has the desired thickness.

8. The method according to claim 1, further comprising an annealing step of annealing the silicon layer in a reduction atmosphere prior to the thinning step.

9. The method according to claim 8, wherein the reduction atmosphere contains hydrogen.

10. The method according to claim 8, wherein the reduction atmosphere contains hydrogen and a rare gas.

11. The method according to claim 1, wherein the preparation step includes steps of:
    bonding a silicon layer formed on a first member containing porous silicon to a second member through an insulating layer to form a bonded substrate stack; and
    forming a substrate which has a silicon layer on an insulating layer by removing the first member from the bonded substrate stack.

12. The method according to claim 1, wherein the preparation step includes steps of:
    implanting ions in a silicon member on which an insulating layer is formed to form an ion-implanted layer inside the silicon member;
    bonding the silicon member to another member to form a bonded substrate stack; and
    forming a substrate which has a silicon layer on an insulating layer by dividing the bonded substrate stack at the ion-implanted layer.

13. A substrate manufacturing method comprising:
    a preparation step of preparing a substrate which has a silicon layer on an insulating layer; and
    a thinning step of thinning the silicon layer on the insulting layer to a desired thickness,
    wherein in the thinning step, a unit thinning step including an oxidation step of oxidizing a surface of the silicon layer by a predetermined thickness not more than a thickness of substantially one lattice and a removal step of selectively removing silicon oxide formed in the oxidation step is performed at least once.

14. A substrate manufacturing method comprising:
    a preparation step of preparing a substrate which has a silicon layer on an insulating layer; and
    a thinning step of thinning the silicon layer on the insulting layer to a desired thickness,
    wherein in the thinning step, a unit thinning step including an oxidation step of oxidizing a surface of the silicon layer by a predetermined thickness, and a removal step of selectively removing silicon oxide formed in the oxidation step is performed not less than twice, and
    the method further comprising a determination step of determining a repetition count of the unit thinning step required to thin the silicon layer to the desired thickness,
    wherein the unit thinning step is repeated in accordance with the repetition count determined in the determination step.

15. A substrate manufacturing method comprising:
    a preparation step of preparing a substrate which has a silicon layer on an insulating layer; and
    a thinning step of thinning the silicon layer on the insulting layer to a desired thickness,
    wherein in the thinning step, a unit thinning step including an oxidation step of oxidizing a surface of the silicon layer by a predetermined thickness, and a removal step of selectively removing silicon oxide formed in the oxidation step is performed not less than twice, and the method further comprising:

a measurement step of measuring a thickness of the silicon layer; and a determination step of determining the repetition count of the unit thinning step required to thin the silicon layer to the desired thickness, on the basis of a measurement result in the measurement step, wherein the unit thinning step is repeated in accordance with the repetition count determined in the determination step.

16. The method according to claim 15, wherein the measurement step is performed prior to the unit thinning step for the first time.

17. A substrate manufacturing method comprising:

a preparation step of preparing a substrate which has a silicon layer on an insulating layer; and a thinning step of thinning the silicon layer on the insulting layer to a desired thickness, wherein in the thinning step, a unit thinning step including an oxidation step of oxidizing a surface of the silicon layer by a predetermined thickness, and a removal step of selectively removing silicon oxide formed in the oxidation step is performed not less than twice, and the method further comprising:

a measurement step of measuring a thickness of the silicon layer; and a determination step of determining on the basis of a measurement result in the measurement step whether the silicon layer has the desired thickness wherein the unit thinning step is repeated until it is determined in the determination step that the silicon layer has the desired thickness.

* * * * *

UNITED STATES PATENT AND TRADEMARK OFFICE
CERTIFICATE OF CORRECTION

| | | |
|---|---|---|
| PATENT NO. | : 7,256,104 B2 | |
| APPLICATION NO. | : 10/841621 | |
| DATED | : August 14, 2007 | |
| INVENTOR(S) | : Masataka Ito et al. | |

It is certified that error appears in the above-identified patent and that said Letters Patent is hereby corrected as shown below:

COLUMN 3:

Line 14, "insulting" should read --insulating--;
    Line 26, "insulting" should read --insulating--; and
    Line 36, "a insulating" should read --an insulating--.

COLUMN 7:

Line 7, "202a-can" should read --202a can--; and
    Line 22, "ions are" should read --ions is--.

COLUMN 9:

Line 20, "increase" should read --increases--.

COLUMN 13:

Line 59, "having" should read --has--.

COLUMN 17:

Line 10, "0.05 defects/cm." should read --0.05 defects/cm$^2$--; and
    Line 60, "with as" should read --as--.

COLUMN 31:

Line 34, "insulting" should read --insulating--.

COLUMN 32:

Line 36, "insulting" should read --insulating--;
    Line 47, "insulting" should read --insulating--; and
    Line 64, "insulting" should read --insulating--.

UNITED STATES PATENT AND TRADEMARK OFFICE
CERTIFICATE OF CORRECTION

PATENT NO. : 7,256,104 B2
APPLICATION NO. : 10/841621
DATED : August 14, 2007
INVENTOR(S) : Masataka Ito et al.

It is certified that error appears in the above-identified patent and that said Letters Patent is hereby corrected as shown below:

<u>COLUMN 34</u>:

Line 2, "insulting" should read --insulating--; and
Line 13, "thickness" should read --thickness,--.

Signed and Sealed this

Twenty-ninth Day of April, 2008

JON W. DUDAS
*Director of the United States Patent and Trademark Office*